(12) United States Patent
McKim et al.

(10) Patent No.: US 8,977,527 B2
(45) Date of Patent: Mar. 10, 2015

(54) SYSTEM AND METHOD FOR AUTOGENERATING SIMULATIONS FOR PROCESS CONTROL SYSTEM CHECKOUT AND OPERATOR TRAINING

(71) Applicant: Invensys Systems, Inc., Foxboro, MA (US)

(72) Inventors: Gregory McKim, San Diego, CA (US); Prashant Karbhari, Sugar Land, TX (US)

(73) Assignee: Invensys Systems, Inc., Foxboro, MA (US)

( * ) Notice: Subject to any disclaimer, the term of this patent is extended or adjusted under 35 U.S.C. 154(b) by 0 days.

(21) Appl. No.: 13/683,585

(22) Filed: Nov. 21, 2012

(65) Prior Publication Data

US 2013/0124175 A1 May 16, 2013

Related U.S. Application Data

(62) Division of application No. 12/372,731, filed on Feb. 17, 2009, now Pat. No. 8,332,193.

(60) Provisional application No. 61/029,191, filed on Feb. 15, 2008.

(51) Int. Cl.
| | |
|---|---|
| *G06G 7/48* | (2006.01) |
| *G06F 17/50* | (2006.01) |
| *C09B 9/00* | (2006.01) |
| *G09B 19/00* | (2006.01) |

(52) U.S. Cl.
CPC .............. *G06F 17/5009* (2013.01); *C09B 9/00* (2013.01); *G09B 19/003* (2013.01)

USPC .................................. 703/6; 703/13; 700/29

(58) Field of Classification Search
CPC ........... G09B 9/00; G05B 2219/31472; G05B 2219/32342; G05B 2219/25067; G05B 19/41885; G05B 23/0243; G05B 13/04; G05B 17/00; G06F 9/4428; G06F 2217/74
USPC ........................................................... 703/6
See application file for complete search history.

(56) References Cited

U.S. PATENT DOCUMENTS

| | | | | |
|---|---|---|---|---|
| 6,108,662 | A | * | 8/2000 | Hoskins et al. ............... 700/95 |
| 6,157,864 | A | * | 12/2000 | Schwenke et al. ............ 700/79 |
| 6,795,798 | B2 | | 9/2004 | Eryurek et al. |
| 6,865,509 | B1 | | 3/2005 | Hsiung et al. |
| 7,257,523 | B1 | | 8/2007 | Nixon et al. |
| 7,260,501 | B2 | * | 8/2007 | Pattipatti et al. ............. 702/183 |
| 7,702,409 | B2 | | 4/2010 | Lucas et al. |
| 7,873,500 | B1 | | 1/2011 | Brewton et al. |

(Continued)

OTHER PUBLICATIONS

Lehtonen, Tuukka, "Ontology-Based Diagram Methods in Process Modeling and Simulation", Thesis, Helsinki University of Technology, May 7, 2007.*

(Continued)

*Primary Examiner* — Mary C Jacob
(74) *Attorney, Agent, or Firm* — Thomas J. Roth, Esq.

(57) ABSTRACT

A method and system for automatically generating simulations for a distributed control system is disclosed herein. A programmed process model generator automatically incorporates a variety of process model data from pre-defined model libraries into descriptions of process equipment including control devices to render simulation models of various degrees of fidelity.

14 Claims, 19 Drawing Sheets

(56) References Cited

U.S. PATENT DOCUMENTS

| | | |
|---|---|---|
| 8,332,193 B2 | 12/2012 | McKim et al. |
| 2005/0223120 A1 | 10/2005 | Scharold et al. |
| 2007/0208549 A1 | 9/2007 | Blevins et al. |

OTHER PUBLICATIONS

Brandt et al, "An Ontology-Based Approach to Knowledge Management in Design Processes", Computers and Chemical Engineering, 32, pp. 320-342, 2008, available online Apr. 24, 2007.*

Lennox et al, "Application of Multivariate Statistical Process Control to Batch Operations", Computers and Chemical Engineering, 24, pp. 291-296, 2000.*

Meciner et al, "High-Fidelity Real Time Dynamic Process Simulation with Object-Oriented Programming Part 1: The Tool", Control Systems conference, Whistler, BC, 1992.*

Goldfarb et al, "Process Modeling for Design, Commissioning and Operational Analysis", Computers chem. Engng. vol. 19, Suppl., 1995.*

Intergraph Corporation, "A Gentle Introduction to the Smart Plant Schema", Version 2008, Jan. 2008.*

Johansson et al, "Engineering Design Tool Standards and Interfacing Possibilities to Modelica Simulation Tools", The Modelica Association, Sep. 4-5, 2006.*

Lehtonen, Tuukka, "Ontology-Based Diagram Methods in Process Modelling and Simulation", Master's Thesis, Helsinki University of Technology, May 7, 2007.*

Mansy et al., "Step Into The Virtual Plant" www.cepmagazine.org, Feb. 2002, pp. 56-61.

International Search Report for PCT/US09/34447 and Written Opinion of the International Searching Authority dated Apr. 7, 2009.

Aspentech, HYSYS 2004.2 User Guide, 2005, 533 pgs. (Submitted in two (2) separate parts).

Boudreau et al., "Maximizing PAT Benefits from Bioprocess Modeling and Control," Pharmaceutical Technology, Nov. 1, 2006, 6 pgs.

Cox et al., "Can Simulation Technology Enable a Paradigm Shift in Process Control? Modeling for the Rest of Us," Computers and Chemical Engineering, 30, pp. 1542-1552, 2006.

Invensys, "SIMSCI-ESSCOR, Dynsim 4.2, Getting Started: An Installation and Tutorial Guide", Jun. 2007, 78 pgs.

McMillan, G., "Modeling and Simulation of Processes", Instrument Engineers' Handbook, Fourth Edition, Process Control and Optimization, vol. II, 2006, pp. 234-241.

Tu et al., "ForeSee—A Hierarchical Dynamic Modeling and Simulation System of Complex Processes," Computers and Chemical Engineering, 30, pp. 1324-1345, 2006.

Office Action issued Mar. 12, 2012 in related U.S. Appl. No. 12/372,731, now issued as Patent No. 8,332,193—15 pgs.

Response filed Jul. 12, 2012 to Office Action in related U.S. Appl. No. 12/372,731, now issued as Patent No. 8,332,193—17 pgs.

* cited by examiner

```xml
<Mapping AABBCC="1B2I01" SPPIDDesc="Large 1 diameter, 1 chamber, elliptical head horizontal drum" DSSClass="CCDRUM" ImageType="Horizontal">
  <PRM>
    <PRM_NAME>ORIENTATION</PRM_NAME>
    <PRM_ASSN>HORIZONTAL</PRM_ASSN>
  </PRM>
</Mapping>
<Mapping AABBCC="1B2I03" SPPIDDesc="Medium 1 diameter, 1 chamber, elliptical head horizontal drum" DSSClass="CCDRUM" ImageType="Horizontal">
  <PRM>
    <PRM_NAME>ORIENTATION</PRM_NAME>
    <PRM_ASSN>HORIZONTAL</PRM_ASSN>
  </PRM>
</Mapping>
<Mapping AABBCC="1B2I04" SPPIDDesc="1 diameter, 1 chamber, elliptical head horizontal drum" DSSClass="CCDRUM" ImageType="Horizontal">
  <PRM>
```

FIG. 17

```xml
<SPPIDInstrCodeDSSParamMap>
<!--Override DSSModelClass if the corresponding DSSParameter is different from the default one -->
<Instrument Desc="Temperature" Code="TT" DSSModelClass="Default" DSSParameter="T" AddTransmitter="true" TransmitterUOMClass ="TEMPERATURE" DSSImageType ="Temperature Transmitter"/>
<Instrument Desc="Pressure" Code="PT" DSSModelClass="Default" DSSParameter="P" AddTransmitter="true" TransmitterUOMClass ="PRESSURE" DSSImageType ="Pressure Transmitter"/>
<Instrument Desc="Flow (Mass)" Code="FT" DSSModelClass="Default" DSSParameter="W" AddTransmitter="true" TransmitterUOMClass ="MASSRATE" DSSImageType ="Flow (dp) Element"/>
<Instrument Desc="Level" Code="LT" DSSModelClass="Default" DSSParameter="L" AddTransmitter="true" TransmitterUOMClass ="LEVEL" DSSImageType ="Level Transmitter"/>
<Instrument Desc="Burner" Code="BT" DSSModelClass="Default" DSSParameter="T" AddTransmitter="true" TransmitterUOMClass ="TEMPERATURE" DSSImageType ="Temperature Transmitter"/>
<Instrument Desc="Burner" Code="BJ" DSSModelClass="Default" DSSParameter="T" AddTransmitter="true" TransmitterUOMClass ="TEMPERATURE" DSSImageType ="Temperature Transmitter"/>
<Instrument Desc="Density" Code="DT" DSSModelClass="Default" DSSParameter="R" AddTransmitter="true" TransmitterUOMClass ="DENSITY" DSSImageType =""/>
<Instrument Desc="Power" Code="JT" DSSModelClass="Default" DSSParameter="Power" AddTransmitter="true" TransmitterUOMClass ="POWER" DSSImageType =""/>
<Instrument Desc="Speed" Code="NT" DSSModelClass="Default" DSSParameter="Speed" AddTransmitter="true" TransmitterUOMClass ="SPEED" DSSImageType ="Speed Transmitter"/>
<Instrument Desc="Speed" Code="ST" DSSModelClass="Default" DSSParameter="Speed" AddTransmitter="true" TransmitterUOMClass ="SPEED" DSSImageType ="Speed Transmitter"/>
<Instrument Desc="Weight" Code="WT" DSSModelClass="Default" DSSParameter="W" AddTransmitter="true" TransmitterUOMClass ="MASSFLOW" DSSImageType ="Flow (dp) Element"/>

<UomMap>
    <user>PSIG</user>
    <Dynsim>psig</Dynsim>
    <UomClass>Pressure</UomClass>
</UomMap>
<UomMap>
    <user>DEGF</user>
    <Dynsim>F</Dynsim>
    <UomClass>Temperature</UomClass>
</UomMap>
<UomMap>
    <user>DEG F</user>
    <Dynsim>F</Dynsim>
    <UomClass>Temperature</UomClass>
</UomMap>
<UomMap>
    <user>GPM</user>
    <Dynsim>gal/min</Dynsim>
    <UomClass>VolumeRate</UomClass>
</UomMap>
```

| Cause    Effect→ | FC | LC | PC | TI |
|---|---|---|---|---|
| FC | 1, 60 | 0.2, 300 | 0.02, 240 | 0.01, 300 |
| LC | 0, 0 | 1, 120 | 0.1, 240 | 0.05, 300 |
| PC | -0.05, 240 | -0.02, 180 | 1, 60 | 0.02, 300 |

SYSTEM AND METHOD FOR AUTOGENERATING SIMULATIONS FOR PROCESS CONTROL SYSTEM CHECKOUT AND OPERATOR TRAINING

CROSS-REFERENCE TO RELATED APPLICATION

This application is a divisional of commonly owned U.S. application Ser. No. 12/372,731, filed Feb. 17, 2009, which claims the priority benefit of U.S. Provisional Patent Application Ser. No. 61/029,191, filed Feb. 15, 2008, all of the contents of which are incorporated herein by reference in their entirety, including the contents of any references contained therein.

TECHNICAL FIELD

The present invention generally relates to the field of programmable/configurable computerized distributed control systems. More particularly, the invention relates to simulators that are used to checkout and/or to train operators on a particular configuration of a distributed control system prior to going on-line.

BACKGROUND

The design and construction of a new or retrofit process (power, chemical, refinery or other) plant is incredibly complex and expensive, involving designers, engineers, and construction teams from many different companies and disciplines, all attempting to perform their work in parallel to get the plant built and up-and-running in the shortest time possible. Typically there is one entity responsible for the design, construction, and turnkey delivery of the plant to the end client: the Engineering Procurement Construction Contractor (EPC). The EPC subcontracts and manages individual suppliers, which includes the control system and operator training simulator providers.

The sooner the plant is up-and-running, the sooner the end client starts earning revenue on their production, sometimes easily totaling millions of dollars per day for a large plant. Thus, project incentives and penalties are used to motivate suppliers to accelerate schedule. For control system (and other) providers, the negative side of this is that the plant design can be "iterative" as multiple teams scramble to finish their work, leading to major system design revisions that potentially force rework. Depending on the contract structure, these rework costs are not always recoverable.

In addition to the plant control system, sometimes the overall contract calls for a plant Operator Training Simulator (OTS). The OTS, a process model married to the final control system, has a long development lead-time and must often wait for the plant physical design and control system to be complete before it itself can be completed. However, an OTS is often required significantly before the plant is in operation to allow enough time for training, and so is severely pinched by the other project constraints. Although minor players in terms of the total cost to build the plant, the control system and OTS are often very high risk factors to the plant owners. If they are not completed on time or are of poor quality, it could cost tens-of-millions of dollars of lost revenue while the problems are resolved. Performing a control system checkout on a full high-fidelity OTS has proven benefits of significantly increasing quality and performance.

Implementing a new control system (e.g., control, safety, fire and gas, etc.) of a process plant (e.g., power, chemical, refinery, etc.) is potentially extremely complex. However, the correct design of a new control system is critical to the safe and efficient operation of the process plant. Part of the implementation process involves validating the control system design. However validation of a design is difficult to accomplish prior to bringing a system online since validation depends on the process control elements sending and receiving valid stimuli to/from the physical processes that the control system is acting on. Additionally, the control system software for distributed control systems typically comprises thousands of control blocks and interface (I/O) points to the plant. Checking out the configuration and operation of the configured control system software during checkout can therefore be extremely time consuming.

FIG. 1 shows a typical hardware layout for a plant control system. For the purposes of the description of the illustrative embodiments, a control system potentially includes, in addition to a distributed control system, a safety instrumentation system, emergency shutdown system, fire and gas system, or any combination thereof. The control system uses control blocks to execute logical and mathematical functions to control the physical processes in the plant. These are configurable software blocks which are processed by the system's control processors (see, FIG. 1, control processors). An illustrative depiction of a set of control blocks is provided in FIG. 2. FIG. 2 shows a Manual/Auto station, which allows a control system operator to enter a desired process value when in Manual status, a Switch block, which selects between two inputs depending on an input mode, and a Follow/Hold block, which follows the input or "holds" in place, depending on an input mode. The illustrative control blocks respond to feedback stimuli/values (F3) from process instrumentation in the plant, and the blocks send their outputs (F1) to physical control devices (actuators, pumps, motors, etc.) in the plant. The communication to/from the plant instrumentation and actuators are via Input/Output modules (I/O modules), as shown in FIG. 1.

Proper operation of the control system depends upon the design and layout of the control blocks—a task generally assigned to a control system application engineer. While the control blocks can be created or based upon design best-practices, without the proper testing technology it can be difficult or even impossible to test process control logic for correct function until the system is installed in the plant. The inability to "pretest" process control logic potentially introduces a high risk element to a project for installing a new/redesigned process in a plant. The risks of installing process control logic without pre-testing/verification include financial hardships caused by project delays, damage to equipment, and injury to personnel. Application engineers perform simple tests of a process control system by simply emulating plant behavior, however in known test systems the quality of emulation is generally low, requires modifications to the process control system logic just to enable testing, and is time consuming to create. Illustrative examples of known test systems are summarized below.

Known methods for tieback-type testing (feeding back inputs to process control logic in response to control outputs provided by the control logic) of a distributed process control configuration require various arrangements of actual process control system hardware (e.g., control processors) to carry out testing. One type of tieback simulation (see, e.g., FIG. 3A) involves staging the entire hardware and software systems to be assembled, with tieback done by using actual wires or signal generators to loop output signals (representing signal values from a simulated process) back to input signals on an I/O module.

Another approach (see, FIGS. 3B and 3C) involves building simulation-type blocks within the actual control system software, and connecting the simulation blocks to the I/O software blocks. The approach depicted in FIGS. 3B and 3C does not require connection of input/output parameters of the control logic to actual (physical) I/O modules, however the control logic (including simulation blocks) is still loaded and run on real control processors. It is also necessary to modify the I/O software blocks to turn off the connection (see, FIG. 3B, AOUT and AIN I/O connections) to I/O hardware, and to reconfigure each block that is intended to connect to I/O hardware to accept inputs from a simulation block.

Another known approach (see, FIG. 3D) to simulation/testing uses commercially-available simulation software to provide simple process simulation. Like the second method, the I/O control blocks are modified to turn off their connections to physical I/O modules. Off-board simulation software, running for example on the operator's computer system, reads/writes to the I/O blocks via a special application program interface (API). This software potentially includes a quick configurator to connect simulator algorithms to a single input and output block based on an I/O block naming convention.

With regard to the aforementioned existing tieback simulation approaches: (1) all require actual control system hardware, including networking interfaces (the first method requires actual I/O modules); (2) the second and third methods require that the control system configuration be modified to turn off connection to physical I/O; and (3) all three methods have no mechanism for setting/resetting the control system and model states to a desired initial condition.

Dynamic process simulation is an invaluable tool for everything from validating the design of a process plant (power, chemical, refinery, etc.), as a tool to checkout the performance of the plant control or safety systems, and as an operator training simulator. However, several challenges are faced when providing a dynamic process simulation including: long development times, a need for highly-skilled simulation domain experts, the likely that a plant and/or control system design will evolve while a simulator design/configuration is in development—which leads to reworking the simulation, an actual plant size (and associated control system) is often immense—which requires a large team to build and configure process models; a process design can include descriptions from disparate data sources including equipment data sheets, piping and instrumentation diagrams (P&IDs) showing the layout of a plant process, and instrumentation lists.

Many process control systems, such as those implemented in power plants or petroleum refineries, need to be checked for correct design, configuration, and connection before deployment. Failure to do so could result in plant malfunctions that potentially lead to inefficient performance, damage to plant equipment or injury to personnel.

SUMMARY OF THE INVENTION

A simulation generator and method are described herein for generating simulation definitions for use in checkout and operator training for a distributed control system configuration. A process simulation interface to a control system is described. The resulting process control simulator supports simulating physical processes of the plant in order to provide realistic stimuli to the control system such that its correct behavior can be validated.

To facilitate computer-automated construction of the process simulation, a rules-based simulation generator is provided that interprets a provided control system design and automatically creates the required process models and connects them to the control system interface points—thus making the creation of control system checkout simulations from configured process control design entirely automatic. The checkout of a process control system is done in a virtual environment on, for example, a personal computer or networked set thereof, thus eliminating the requirement for a complete suite of control system hardware (e.g., control processors) and software.

Automation tools gather and synthesize required data from multiple plant design resources (e.g., P&IDs) to create, configure, and parameterize dynamic process simulation models to provide an automatically-created plant process simulator, for process design analyses, control system design checkout, and operator training and familiarization.

A process simulation model is also described comprising a set of cause and effect relationships between process parameters. Such cause and effect relationships are defined in a design environment as a matrix which is thereafter incorporated into a dynamic simulation of the modeled process connected to a set of I/O blocks of a process control system.

BRIEF DESCRIPTION OF THE DRAWINGS

While the claims set forth the features of the present invention with particularity, the invention, together with its objects and advantages, may be best understood from the following detailed description taken in conjunction with the accompanying drawing of which:

Figure 6:
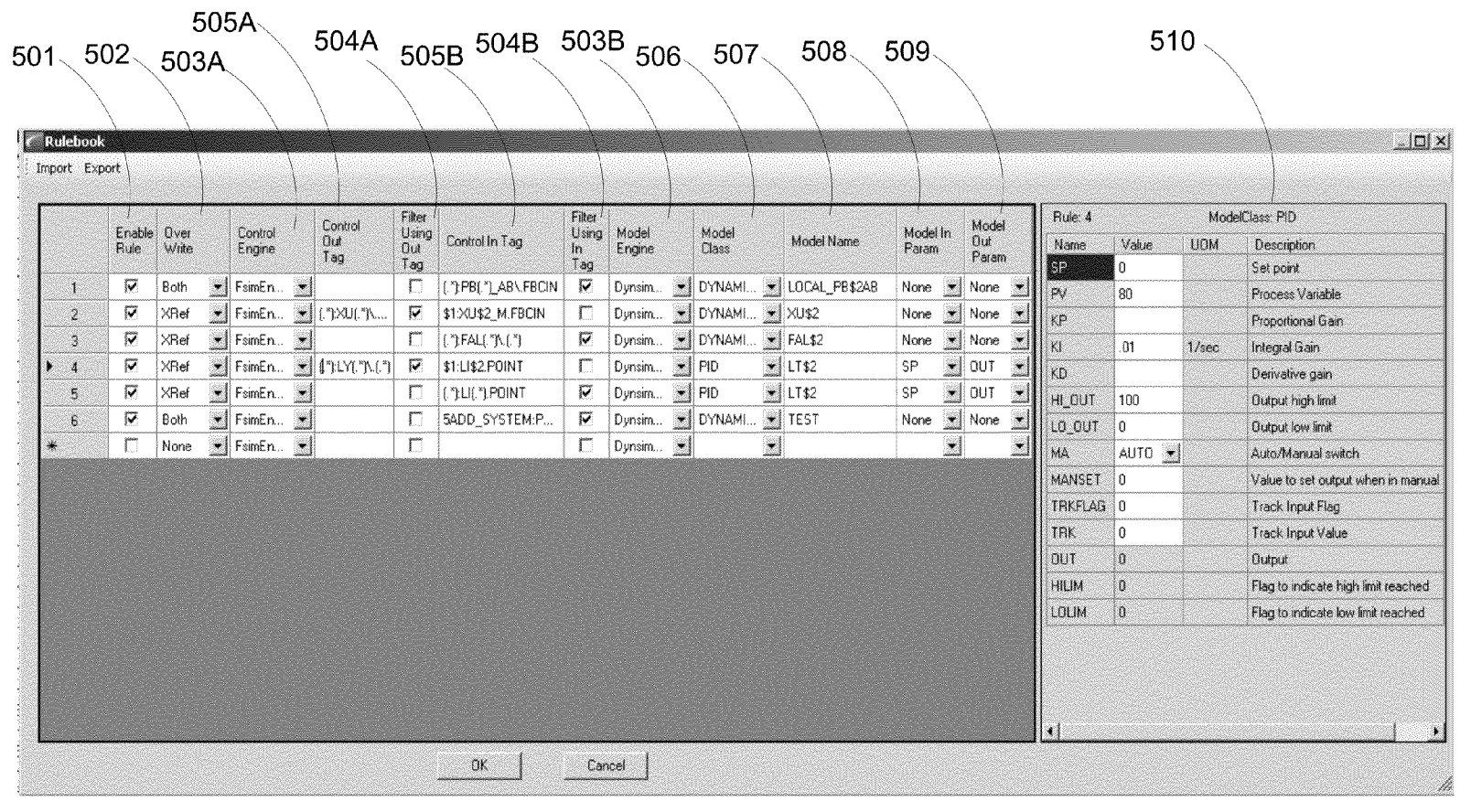

FIG. 6 illustratively depicts an exemplary rulebook editor interface;

FIG. 11B provides an exemplary source object's AABBCC equipment code, and the P&ID-to-model mapping file contents;

FIG. 17 illustratively depicts contents of a sample instrument mapping file and a units-of-measure mapping file;

DETAILED DESCRIPTION OF THE DRAWINGS

Figure 1:
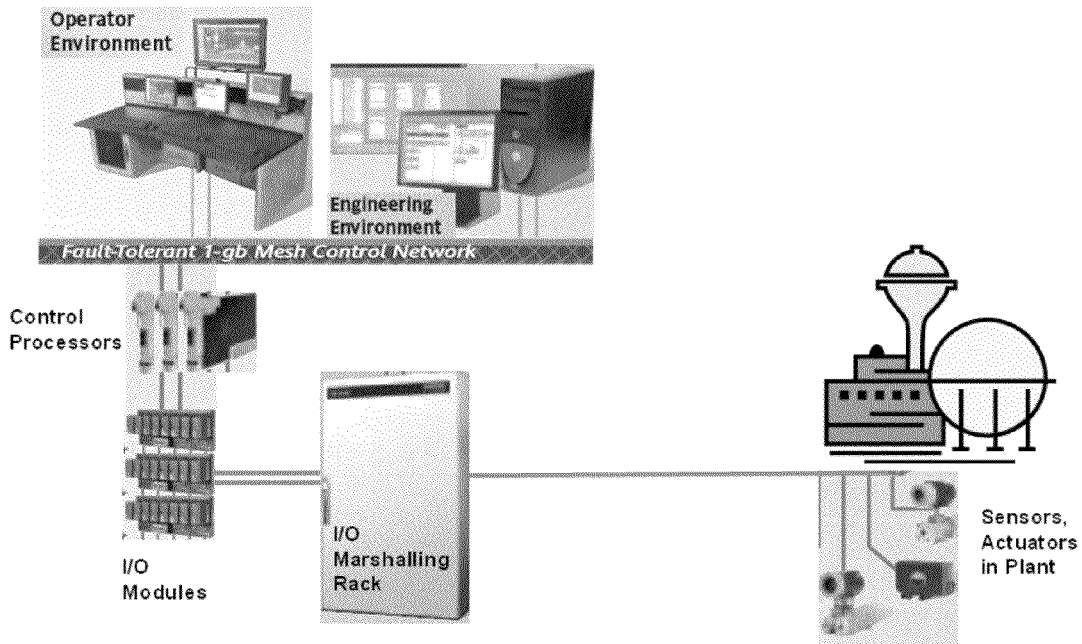
FIG. 1 is an exemplary network drawing depicting a typical hardware layout for a plant control system.
Figure 2:
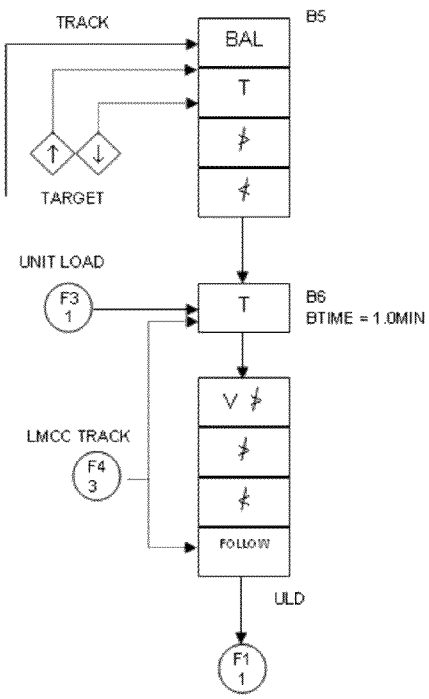
FIG. 2 illustratively depicts a set of control blocks.

The following description is based on illustrative embodiments of the invention and should not be taken as limiting the invention with regard to alternative embodiments that are not explicitly described herein.

The process control system simulation generator and platform described herein is described with reference to various levels of test/simulation detail. The following definitions relate to the description of exemplary process control test/simulation software/systems contained herein. A "tieback" simulation is used to carry out device-level simulations and involves single loop control (no interactions between control loops) simulation. An "equipment-level" simulation involves modeling a piece of process equipment and potentially involves multiple loop (interaction) testing. Yet another type of simulation applies physical/chemical principles to execute a process control system simulation at a plant-level wherein an entire process/plant's control is simulated according to detailed simulation models incorporating actual physical characteristics of plant equipment (e.g., pipe dimensions/connections/bends) and the materials processed therein.

A first enhancement to known simulation generator and platform systems, described herein, provide a highly automated tieback model builder to test controls (low fidelity simulation). The illustrative system leverages known existing SIMSCI-ESSCOR FSIM/TRISIM/DYNSIM simulator product capabilities, to provide the following functionality:

Automatic building of simulation model and cross-reference database tables;

Providing a user-defined rulebook for generating simulations that uses control block naming conventions; and Providing a library of simple tieback functions (latch, time delay, etc) for incorporation into the automatically generated simulations.

A second enhancement to known simulation systems enables users to build simplified, non-first principle simulation models for processes, and allows these non-first principal simulation models to be automatically generated. The second enhancement to known simulation systems supports the following functionality:

Automatic building of a simulation model and the cross-reference database tables, using a combination of a SMARTPLANT (SP) database available from the Intergraph Corporation and, if necessary, an I/A process control configuration available from Invensys Systems, Inc.;

Automatic creation of SIMSCI-ESSCOR DYNSIM model objects based on objects and instruments found on a SMARTPLANT Piping and Instruction Diagram (SP P&ID). For instance, the user can look for an instrument tag and see the device/element to which the tag is attached to (valve, motor, vessel);

Providing a user-defined rulebook that uses control block naming conventions, combined with use of a user community defined template library;

Supporting using a standard SIMSCI-ESSCOR DYNSIM graphical user interface to create and modify the simulation models;

Supporting one way, one time model creation (manual edits are lost if the model is recreated because of a change to the IO configuration);

Supporting unit operation-level simulation from SMARTPLANT P&ID (SP P&ID);

Providing an equipment-level simulation model from SP P&ID definition objects;

Producing a non-physical process model of a unit's operation that is represented on a single P&ID object definition;

Providing an interface to other plant areas in the form of fixed boundary conditions; and Supporting testing interaction of several loops on individual unit operations;

A third further aspect to an enhanced process simulator model generation and platform system described herein below involves providing a highly automated "cause and effect" process simulation model builder. The resulting process simulation models are suitable for operator training simulators and/or rigorous control configuration testing/checkout. The third enhancement to process simulator model generation systems supports the following functionality:

Automatic building process simulation models and cross-reference database tables using a combination of a SMARTPLANT (SP) database and, if necessary, an Invensys Systems, Inc. I/A control configuration;

Providing a user-defined rulebook building in process/dynamic simulation engineering know-how;

Supporting models that do not execute in a numerically stable manner without engineering expertise manually applied to make a usable plant model;

Supporting one way, one time model creation (manual edits are lost if the model is recreated because of a change to the IO configuration);

Creating an entire process simulation model from an SP P&ID, including interpreting each type of P&ID drawing object as an appropriate type of simulation model object and possibly create a Steady-State Process Flow engineering analysis model at same time;

Supporting initializing a model from a steady-state data provider (such as Pro II) by linking, through SMARTPLANT FOUNDATION information management, the process stream data to initialize a SIMSCI-ESSCOR DYNSIM process simulation model. ProII, provided by SIMSCI-ESSCOR, is a steady state simulator that enables control engineers to generate design data for configuring a high fidelity process simulation model (not typically available with P&ID).

In yet a further enhancement, a simulator generation and platform system supports two-way data transfer between the simulation environment and data sources for the simulation system while maintaining data integrity. The integrity tasks include ensuring that manual model changes are not overwritten, and manual changes are captured and propagated back to SMARTPLANT FOUNDATION (SPF) information management.

I. Automatic Bulk Generation of Tieback Process Simulation Models

A computer-based simulation generation system and method are described herein that facilitate rapid, accurate, and cost-effective generation of simulation models for validating process control system logic design. The logic design comprises, for example, a set of function blocks executed within one or more control processors in a runtime process control environment. The process simulation models and process control logic are executed on a single simulation platform running, for example, on a single standalone personal computer. The simulation generation method and simulation platform enable verification of control logic before the process control system logic (e.g., function/process control blocks) is installed on plant process control hardware (e.g., a control processor).

Figure 4A:
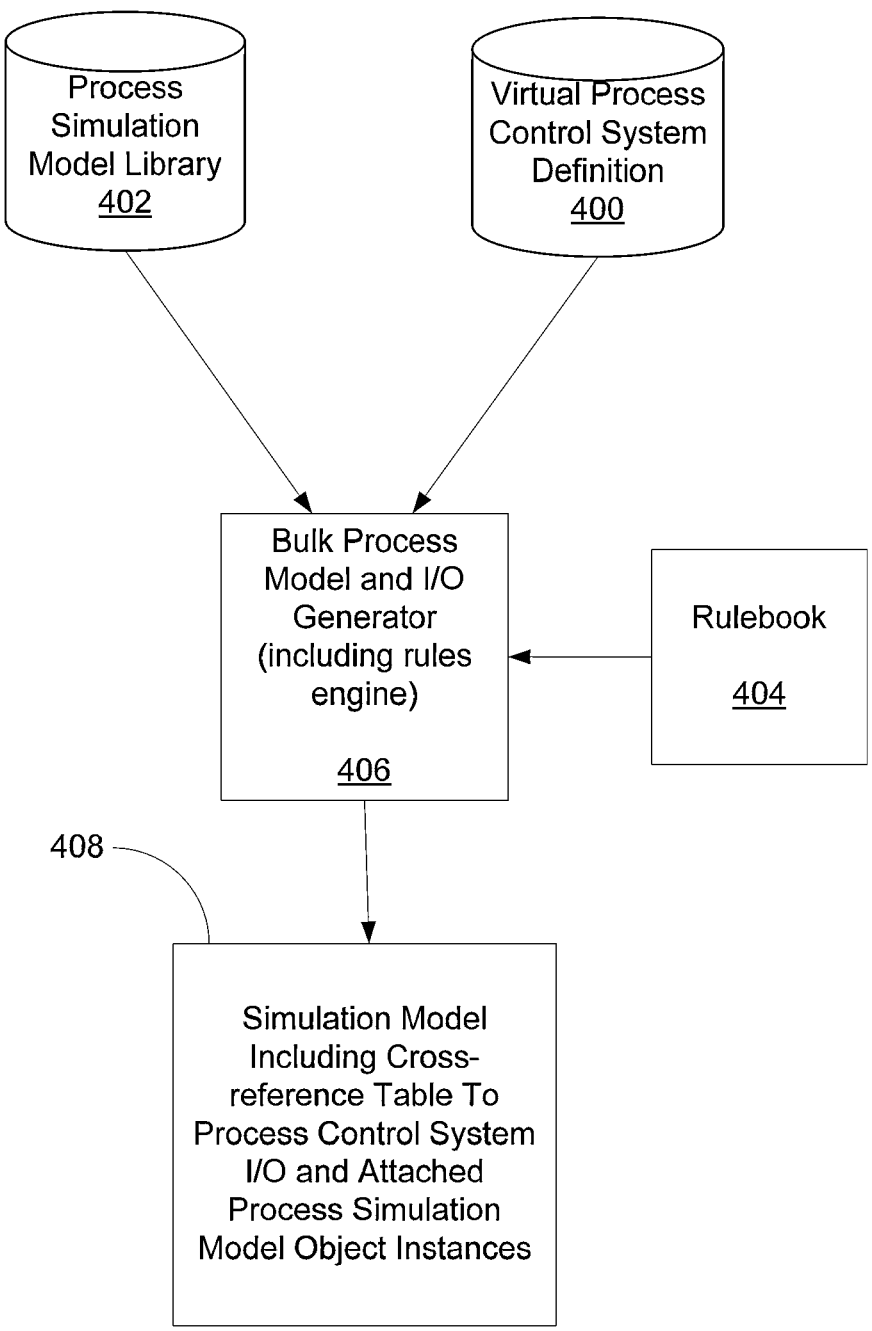
FIGS. 4A and 4B illustratively depict a simulation generation and execution arrangement in accordance with illustrative exemplary embodiments.

Turning to FIG. 4A, the simulation generator facilitating tieback process simulations includes the following components: (1) a virtual process control system definition 400 (e.g., the control processor(s) and associated physical I/O interface to a process), (2) a simulation library 402 including set of process simulation models, and (3) a bulk process model and I/O generator 406 that connects instances of selected ones of the process simulation models from the library 402 to the virtual process control system 400's I/O to render a simulation model 408 comprising the simulation model instances and a cross-reference table tying the simulation model instances to the virtual process control system definition 400 I/O.

In an exemplary embodiment the process simulation model library 402 comprises a set of tieback models that incorporate a variety of process component response behaviors for a simulation of the control system configuration represented by the virtual process control system definition. A table provided below describes an exemplary set of tieback simulation model blocks contained in the process simulation model library 402.

| System to be Modeled | Dynamic Simulation Process Library (402) Entity: | Comment |
|---|---|---|
| Accumulator (integrator), % | PID | KP and KD = 0 |
| Same as above, but in Engineering Units (i.e. lb/hr, psi, etc.) | PID | KP and KD = 0 |
| ANDs a number of inputs, then ORs with another set | AND, OR | Implement as series of blocks, or as an Equation in xref |
| Determines flow for a valve with Equal Percent trim | VALVES | The Valve Object has pickable trim-type |
| Determines flow for a valve with Linear trim | VALVES | The Valve Object has pickable trim-type |
| First order lag | LEADLAG | Lag mode |
| Same as above, but in Engineering Units (i.e. lb/hr, psi, etc.) | LEADLAG | Lag mode |
| Sums inputs | SUM | Sums inputs |
| Same as above, but in Engineering Units (i.e. lb/hr, psi, etc.) | SUM | Sums inputs |
| Sets output = input, if Condition is FALSE | SWITCH | Dual input switch with logical toggle input, or Equation with IF(test, true_value, false_value) |
| Sets output = !input if Condition is TRUE | SWITCH | Dual input switch with logical toggle input, or Equation with IF(test, true_value, false_value) |
| Sets output = input if Condition is TRUE | SWITCH | Dual input switch with logical toggle input, or Equation with IF(test, true_value, false_value) |
| Same as above, but in Engineering Units (i.e. lb/hr, psi, etc.) | SWITCH | Dual input switch with logical toggle input, or Equation with IF(test, true_value, false_value) |
| Used to model Close Limit Switches | VALVES | Valves have open, close limit switch capability |
| =Input 1 + Scale * (Input 2 - Input 1) | MISCEQTN | Miscellaneous equation block, or Equation field within xref |
| Latch | LATCH | Latch block is exact equivalent |
| Output = TRUE if Input > Limit | RLIMIT | All DYNSIM-L Analog blocks have high and low limit alarm capability |
| Output = TRUE if Input > Limit | RLIMIT | All DYNSIM-L Analog blocks have high and low limit alarm capability |
| High select | SELECT | SELECT block has configurable hi, lo, median, and average select mode |
| Calculates level in a horizontal tank | DYNSIM-L | Use DYNSIM pressure-flow solver with Vessel model |
| First order lag | LEADLAG | Lag mode |
| First order lag | LEADLAG | Lag mode |
| Linear interpolation | FUNCTION | Function generator, or CINTRP1 function in Equation |
| Same as above, but in Engineering Units (i.e. lb/hr, psi, etc.) | FUNCTION | Function generator, or CINTRP1 function in Equation |

| System to be Modeled | Dynamic Simulation Process Library (402) Entity: | Comment |
| --- | --- | --- |
| Low limit alarm | RLIMIT | All DYNSIM-L Analog blocks have high and low limit alarm capability |
| Same as above, but in Engineering Units (i.e. lb/hr, psi, etc.) | RLIMIT | All DYNSIM-L Analog blocks have high and low limit alarm capability |
| Low select | SELECT | SELECT block has configurable hi, lo, median, and average select mode |
| Open limit switch | VALVES | Valves have open, close limit switch capability |
| ORs one set of inputs then ANDS with second set | AND, OR | Implement as series of blocks, or as an Equation in xref |
| Calculate pressure drop as function of an exponent | MISCEQTN | Miscellaneous equation block, or Equation field within xref, or DYNSIM-L pressure flow solver |
| Multiply and Divide a number of inputs | MISCEQTN | Miscellaneous equation block, or Equation field within xref |
| Momentary pulse | TIMER | Timer has time delay on, time delay off, and pulse capabilities |
| Output = inverse of input | MISCEQTN | Analog: Out = 100 - Input; Digital out = 1 - Input |
| Mathematical expression | MISCEQTN | or Equation field within xref |
| Weighted average | MASTER | Balancer with multiple inputs, or Equation |

The above described process model blocks support a variety of transfer functions (responses to input from the control system output block parameters) for tieback simulation of control system configurations. Supported transfer function behaviors for single input/output tieback simulations include:

Straight-through (out=in)
Invert
Time delay on
Time delay off
Pulse
Lead
Lag
Random noise generator
Integrator During configuration of a rule, when one of the simulation models is designated from the library 402, a parameter input dialog is presented (right side panel 510 of the rule book editor interface depicted in FIG. 6). The parameter input dialog presents a list of DYNSIM model input parameters that are considered important for process control system checkout by control engineers. In an exemplary embodiment, for each model, a list of input parameters and their description, etc., is prepared and saved in XML format files. The parameters are displayed, for example, in the order of importance for control engineers, and the user interface supports a user changing (user editable) values via a parameterization pane 510 user interface.

In an exemplary embodiment, users have the ability to export and import rules into the rulebook 404. This could be useful in scenarios where the rules are configured once and multiple people use them.

The virtual process control system definition corresponds to the function blocks of an actual regulatory control system design. However, rather than executing the function blocks on an actual control processor, the virtual control system function blocks are executed in a virtual process control system (FSIM) environment with I/O coupled to corresponding I/O provided by a dynamic process simulator (e.g., DYNSIM dynamic process simulator from SIMSCI-ESSCOR) running on a personal computer.

Figure 4B:
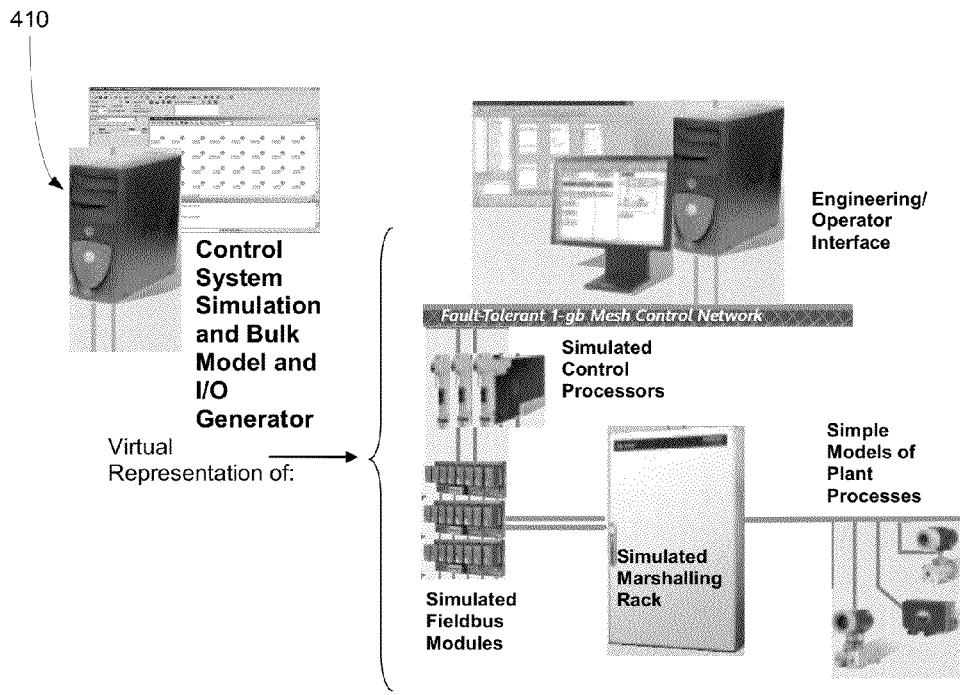

The resulting virtual process control system simulation platform including a personal computer 410, the simulation model 408, a SIMSCI-ESSCOR DYNSIM dynamic process simulator, and the virtual process control definition 400 hosted by a SIMSCI-ESSCOR FSIM simulator is illustratively depicted in FIG. 4B. Furthermore, FIG. 4B illustratively depicts the relationship between the simulation platform (incorporating the simulation model 408) and actual components of a real process control system to which the simulation model 408 and virtual process control system definition correspond. Components shown on the right side of the drawing (actual control system hardware) are completely incorporated into the simulation platform including, by way of example, the general purpose computer 410.

Figure 5:
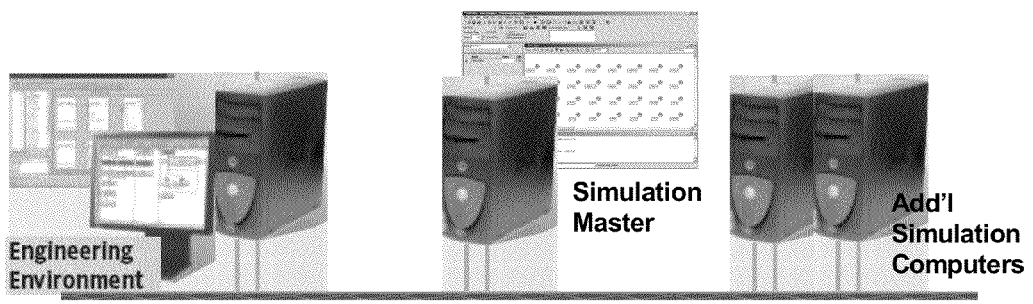
FIG. 5 illustratively depicts an alternative hardware arrangement for carrying out a simulation in accordance with an exemplary embodiment.

In an exemplary embodiment, the virtual process control system definition 400 (including I/O) is created by initially porting the control processor, control block, and I/O module source code from its native hardware Operating System, to run on, by way of example, a standard desktop or laptop computer containing the FSIM process control simulator. In the exemplary embodiment, control blocks corresponding to multiple simulated control processors' control blocks are downloaded and executed on the simulation computer system containing the hosting simulation platform, thus providing a process control simulation/checkout facility at a significantly-reduced hardware cost. For extremely large controls systems, the platform is scalable by adding additional standard computers in a networked fashion (e.g., FIG. 5).

The simulation platform incorporated into the single general purpose computer 410 marries the virtual control system (running the actual control logic in a virtual runtime environment) with a process model. Similar to control system blocks, process model blocks, based on the desired characteristics/ traits of a modeled process, are configured and connected to form a representation of the physical processes of the plant. These models can be, for example, of type: logical functions (AND, OR, If-Then), continuous mathematical functions (Laplace Transform-type), or first-principle mathematical models based on the laws of physics and the conservation of mass, momentum, and energy. The process model stimulates and/or is stimulated by the virtual I/O modules, entirely through software communication protocols (i.e., there are no communications with actual control system hardware such as control processors).

The bulk process model and I/O generator 406 facilitates rapid creation and connection of the process model to the virtual control system to render the simulation model 408. The generator 406 comprises computer executable instructions for automatically:

parsing I/O block names from the virtual process control system definition 400, creating simulation models by a rules engine applying a set of rules specified by a rulebook 404 (see, FIG. 6 Rulebook user interface) to each I/O block name, configuring and parameterizing the simulation models using rules provided by the rules engine, and automatically connecting virtual I/O blocks of a control program to the simulation model inputs and outputs.

In an exemplary embodiment, the bulk model and I/O generator 406 incorporates a standard, commonly-available, spreadsheet program (see, FIG. 6) that supports editing functions such as search-and-replace, filtering, and macros as simulation editing tools (in addition to the rules engine containing computer-executable instructions for automatically generating the simulation models).

An exemplary spreadsheet user interface for creating and viewing a rulebook governing the automatic generation of simulation models from a virtual control system and a process model library is illustratively depicted in FIG. 6. In accordance with an illustrative embodiment, the rules engine within the bulk model and I/O generator 406 applies configured rules contained in the rulebook (illustratively depicted in FIG. 6) to both the virtual control system definition 400 and the process simulation model library 402 to render the simulation model 408.

An Enable Rule field 501 in the exemplary rule book entry structure specifies whether or not the particular rule should be applied. An overwrite field 502 is a multi-value selection field including four choices: "none" specifies neither previously-defined nor custom entries for xref or model will be overwritten (note: "none" will overwrite default points in xref), "xref" specifies overwriting any xref entries for which the rule applies, "model" specifies overwriting any model entries for which the rule applies, and "both" specifies overwriting model and xref entries for which the rule applies.

A control engine field 503A and a model engine field 503B are used to specify a proper control/model engine for generating a simulation model when more than one of such engines is available (e.g., an FSIM engine, a TRISIM engine, and a DYNSIM engine are potentially available in an exemplary embodiment).

A filter using out tag field 504A and a filter using in tag 504B indicate which I/O point is the "search" tag and which is the "paste" tag for a search and replace operation.

Figure 7:
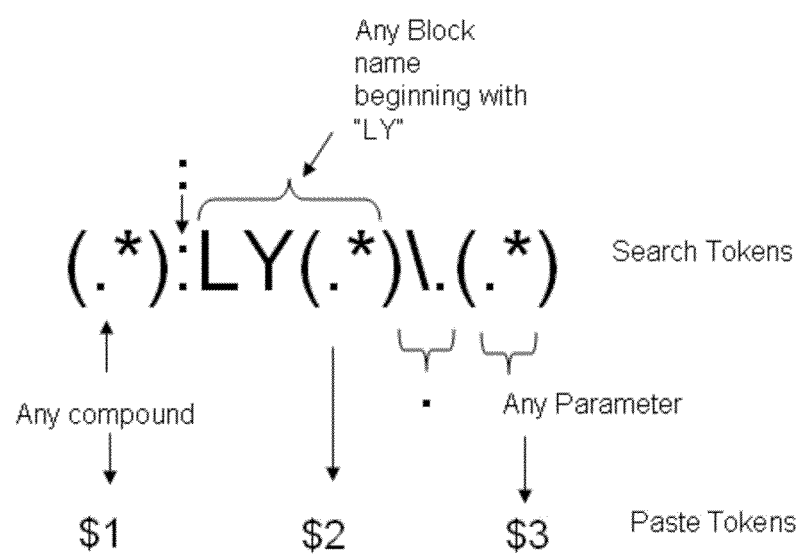
FIG. 7 depicts an exemplary search/replace token defined using regular expression conventions.

A control out tag field 505A and a control in tag field 505B specify a search rule (see, FIG. 7 for explanation of fields of search tokens supporting regular expressions used to search the I/O points of the virtual process control system definition 400 when the bulk generator 406 renders the simulation model 408) for identifying control system analog/digital I/O tag names associated with a control loop to which the rule applies. One point is the "search" tag while the other point is the "paste" tag (based on the status of filter using out/in tag fields 504A/B.

A model class field 506 identifies a type of (tieback) simulation model to be used for the generation of process simulation values.

A model name field 507 specifies a name to assign to any model object created using the search and paste criteria from regular expressions. An exemplary regular expression format is described herein below with reference to FIG. 7.

A Model In parameter field 508 indicates whether to tie the control system output tag to the specified process model input parameter.

A Model Out parameter field 509 indicates whether to tie the process model output parameter back to the control system input tag. The rules features 501-509 create instances of model blocks. The block parameterization pane 510 specifies the tuning parameters of the blocks to be generated. Whenever a row (rule) is selected on the left-side pane, the block parameterization pane 510 displays parameters for the selected model class (specified in model class field 506). Parameter values set via the pane 510 are applied to any model instance meeting the search criterion set forth in tag fields 505A/B.

In the illustrative embodiment, the rules engine (and designated configured rulebook) of the bulk Process Model and I/O Generator 406 employs regular expression syntax to filter I/O block information using the aforementioned search tokens. The search tokens guide searches by the bulk process model and I/O generator 406 for appropriate tags and parameter value fields of tags (see, FIG. 7). In the illustrative example set forth in FIG. 7, an exemplary search token specifies a search for "any compound" containing a block name that begins with "LY" and any parameter. In accordance with an exemplary embodiment, the search token utilizes well known regular expression syntax to specify a search/replace expression for automatically cross-referencing process simulation model inputs/outputs to corresponding virtual process control system I/O blocks.

The search tokens are thus used to: (1) create unique instances of process model simulation blocks, and (2) tie various block parameters to the I/O blocks of the virtual process control system definition 400. This functionality is based upon a user initially loading a plant control system definition onto the computer 410. The computer 410 includes a cross-reference table to equate control system Input/Output tags to models—at this point the table contains only the control tags and not the process simulation models. Thereafter, the user opens the rulebook 404 and creates the rules which will generate the model block instances based on I/O tag names in the control system definition 400. The user runs a translator which, using the rulebook 404 definitions, parses the I/O tags of the virtual process control system definition 400, creates process simulation model object instances, parameterizes the process simulation model objects (also based on rulebook definitions), and connects the process simulation model objects to control system I/O tags in the cross reference table. The user then imports the resulting simulation database file into the DYNSIM dynamic simulation program residing on the general purpose computer 410. In the illustrative example, simulation model generation by the bulk generator 406 includes two interrelated, but separately executable, tasks: (1) a "Translator" task wherein the virtual process control system definition 400's inputs and outputs are parsed, and the resulting parsed definition is transferred to a simulation (e.g., DYNSIM) database, and (2) a "Rulebook" task where operations to be performed on the parsed control system data are defined.

The Translator and Rulebook tasks operate as follows:

For each rule defined in the rulebook, the Translator parses (using the syntax summarized in FIG. 7) every line of the cross reference table looking for I/O tag names that match the Search criteria. The search is done either against output tags (505A in FIG. 6) if search-using-outputs is selected (504A) or input tags (505B) if search-using-inputs is selected (504B).

For each match, a model block instance of type specified in the Rulebook (506 in FIG. 6 is created. The block is named by pasting the Search tokens into the block naming field 507 in FIG. 6.

The model block is configured and parameterized according to the Rulebook definition for the block.

The model block is connected to the Input and Output control tag points in the cross reference table. The model output parameters to be connected in the cross reference table are defined by the .IN parameter field 508 and .OUT parameter field 509.

Thus the translator task, executed by the bulk process model and I/O generator 406, comprises: retrieving data from the virtual process control system definition 400, parsing the definition using the user-defined filtering rules, creating instances of simulation blocks from the model library 402, performing editing operations on the retrieved virtual process control system definition 400's data using the Rulebook 400 (see, configuration of Rulebook 400 below), and sending the data to a receiving simulation database 408. In an exemplary embodiment, the virtual process control system definition 400 used by the translator task to obtain I/O block information is either (1) an already-generated DYNSIM cross reference table, or (2) an actual process control system definition retrieved from a control system configurator database.

In an exemplary embodiment, the translator task renders output in the form of a fully-configured DYNSIM model and a filled-out cross reference table. Here, model refers to fully instantiated, configured, and parameterized simulation blocks; cross-reference table refers to the linking function of simulation blocks to/from the virtual control system input/output tags. The DYNSIM model configuration is, for example, in the form of an XML-import file (that is thereafter converted to a DYNSIM model), or a directly applicable DYNSIM database model. The advantage of the XML-import file being the ability to translate the XML-import file to one or more of a set of supported simulation platforms.

During execution of the Translator task, the bulk process model and I/O generator 406 searches and pastes (i.e., edits) tags within the I/O blocks of the virtual process control system definition 400, based on a filtering criteria specified by the rules set forth in the Rulebook 404, to create blocks and connections that are consistent with an I/O block naming convention. An option to create rules based on I/O/control block configuration is contemplated in accordance with other embodiments.

Turning to the Rulebook task, the Rulebook task uses user-defined parsing rules for creating simulation blocks; the translator will apply these rules against the control system I/O tags to create, configure, and parameterize the models. The Rulebook task supports a user specifying a particular transfer function tieback block (from the process simulation model library 402) to associate with the I/O type (e.g. tank level control, temperature control, etc.). The Rulebook task also facilitates users giving a block a unique name based on the aforementioned "search-and-paste" function supported by the Translator task.

The Translator applies rules and automatically connects inputs and outputs of process simulation model instances created from the model library 402 to appropriate control system I/O point(s) in the cross reference table. In an exemplary embodiment, when the rules of the rulebook 404 are processed, based on the I/O tag/point names, DYNSIM model instances are created and connected to the I/O points by updating the cross-reference table.

The Rulebook task also includes simulation configuration/tuning functionality enabling users to specify transfer function block parameters (e.g. pulse time duration, or high and low limits) that customize the response of a particular tieback loop of the process simulation (tieback) portion of a simulation model. It is noted that in an alternative embodiment, the tieback model rules are built based on block configuration in addition to or instead of a naming scheme. The block configuration information is maintained in an actual process control system configuration database (and not in the cross reference database).

It is possible that bulk configuration is done in stages. For example, control loops are potentially built in stages and at each stage the new portion is bulk-configured and tested. Subsequently, more control loops are added, and there may be a need to bulk configure on a file that has already been bulk-configured once. In that case, it may not be desirable to run the bulk-configuration on all I/Os but rather on only those that haven't been updated. In an exemplary embodiment, selective updating of a previously generated simulation model is carried out through appropriate use of filtering. A specified filter is applied to a spreadsheet and the processing by the bulk generator 406 is carried out only on visible rows. In this case the filter shows only the new I/O, and the rules are applied to the new I/O.

In an exemplary embodiment, an option is provided in a user interface associated with the bulk process model and I/O generator 406 to update all or only the newly added I/Os. For example a checkbox control is provided to configure only new I/O in one of: a rulebook, a prompt during rule processing, or an actions pane. By default, incremental update option is checked, i.e., only new or non-configured I/Os are bulk-configured. If it is unchecked, all I/O blocks are processed.

Once the bulk process model and I/O generator 406 rules engine applies a designated set of rules to render process simulation model objects and connects the simulation model objects to the I/O blocks of the virtual process control system, the resulting simulation model 408 is loaded into memory for processing by the simulation platform (e.g., DYNSIM dynamic process simulator), under the direction of an application engineer, to test/verify the logic/behavior of the virtualized process control system.

During simulation, the virtual process control system function blocks and I/O interact with the elements of the process simulation model in a closed-loop (e.g., tieback) fashion. At any point, an application engineer can make changes to the virtual process control system based on his/her findings and observations, and can continue to test, develop and refine the process control system logic/functionality as desired. The engineer can stop the simulation, add to or modify the simulation model, then start again with the new configuration of the simulation model.

In an exemplary embodiment, the simulation platform that hosts execution of the afore-described simulation model incorporates several time control features that facilitate testing. Such time control features include: freeze, run, snapshot, fast time, slow time, and single-step. With these time-control features, an engineer can go back to previously-saved initial conditions where controls and simulation model are initialized to a desired starting state, and the testing can proceed from there. Slow time and single step time control features are used to examine control block processing on a cycle-by-cycle basis to potentially observe cause and affect behavior of the system.

When an engineer completes testing, the simulation platform includes standard control system application tools that support exporting/importing the control system configuration to/from the actual plant control system, for two-way transfer of the configuration without requiring special modifications to the control system (e.g., function blocks) configuration. Import/export is a native utility of the control system. The file format is the same for a real control system as it is on the simulation platform and no modifications are necessary to move control system configuration between the simulation platform and the actual plant control system.

Figure 3A:
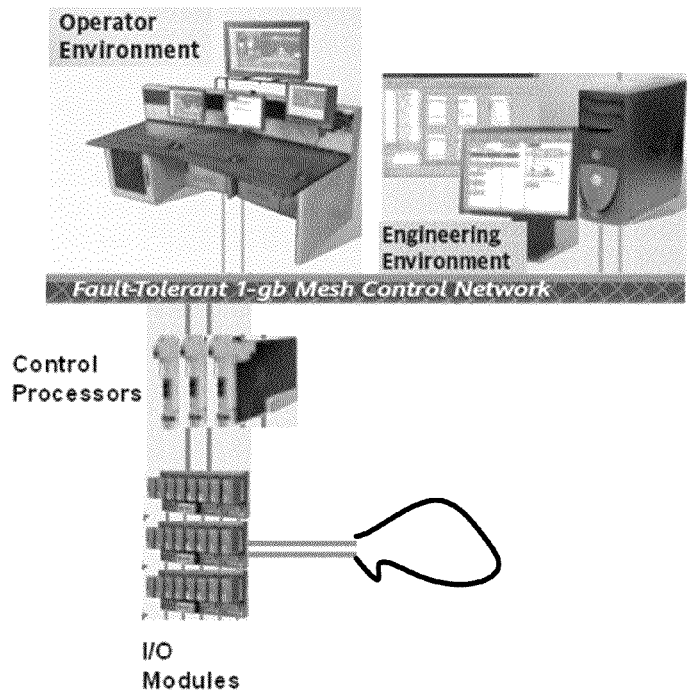
FIGS. 3A-D illustratively depict known simulation hardware/software arrangements for process control.
Figure 3B:
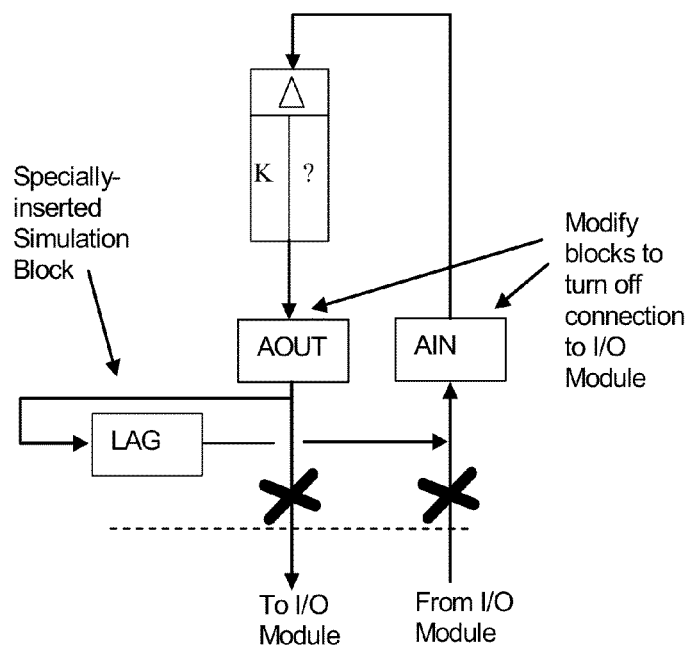
Figure 3C:
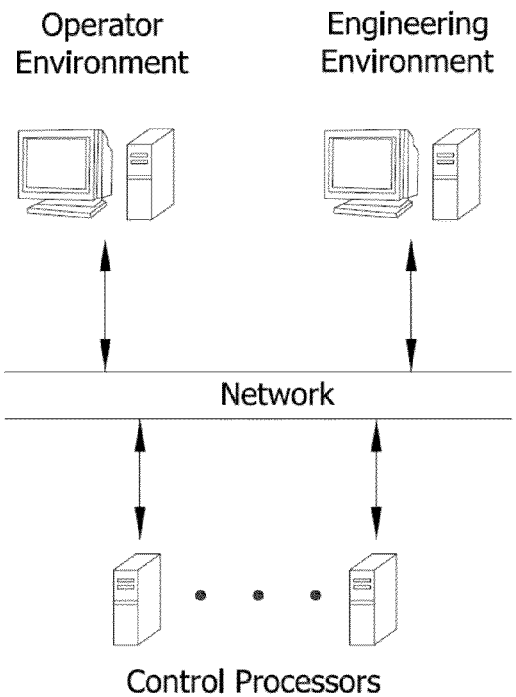
Figure 3D:

Having described a new way of generating a simulation model for execution in a virtual environment that does not rely upon actual process control hardware (e.g., control processors or I/O racks), it is noted that the new simulation generation system and simulation platform support a new workflow for process control simulation generation and use during checkout and operator training. The workflow for the automated simulation system described herein differs from the above-described previous methods in that: (1) no modification of the control block configuration is required, (2) the entire simulation of the control system applications, control blocks, and tieback process model potentially runs on a single general purpose application workstation, and (3) in contrast to the existing system illustratively depicted in FIG. 3D (interface to commercially-available simulation package), multiple tieback simulation blocks can be configured using the bulk configurator rulebook (see, FIG. 6), rather than just on a single input and output block at-a-time basis. The rulebook contains flags that allow a user to selectively overwrite or protect previously-run rules, for both the (a) definition of the model, and (b) connection of the model to I/O tags. Furthermore, configured rulebooks are saved and passed to other engineers/projects, allowing full portability and repeatability between projects.

Previous simulation methods were unable to control simulation time-processing, thus limiting usefulness for simulation scenarios requiring specific time-evolving sequences and an exact definition of initial condition. The system described herein allows for the controls and process models to be precisely initialized to a desired state, and then to save that desired state ("snapshot"), allowing the state to be restored at a later time for testing and re-testing. Restoring a snapshot and then running scenarios can be done in a completely deterministic, repeatable manner giving the control application engineer (and supervising quality assurance validators) total confidence in the predictable behavior of the control system.

II. Automatic Simulator Process Model Generation from P&ID and Other Sources

Having described a tieback simulation model generator that is generally applicable to carrying out single control loop check-out wherein an appropriate simulation model having a particular transfer function is connected between I/O blocks of a control system, attention is directed to the automated creation of relatively "higher" fidelity process simulation models that incorporate, to a certain degree, physical response behaviors of actual plant process equipment. These simulation models are thereafter connected to appropriate I/O blocks of a control system (virtual or actual) in a simulation environment for personnel training and verification of the process control system logic/configuration and the process design (including plant equipment) as a whole.

The simulator process model generator described herein facilitates enhanced industrial plant/process control simulation functionality including: (1) making process simulation-based checkout a part of all control system development project, (2) allowing simulation to be more easily and quickly available (through automatic generation of high quality/realistic simulator process models), (3) supporting configuring and parameterizing the simulation models based on electronic plant design data sources (e.g., software objects representing plant equipment), (4) supporting automatically connecting control system input/output (I/O) tags/blocks to the process simulation model(s)—see, e.g., bulk generator 406 operation described above, and (5) allowing the process simulation model to be more easily updated as the plant or control system designs evolve.

Figure 8:
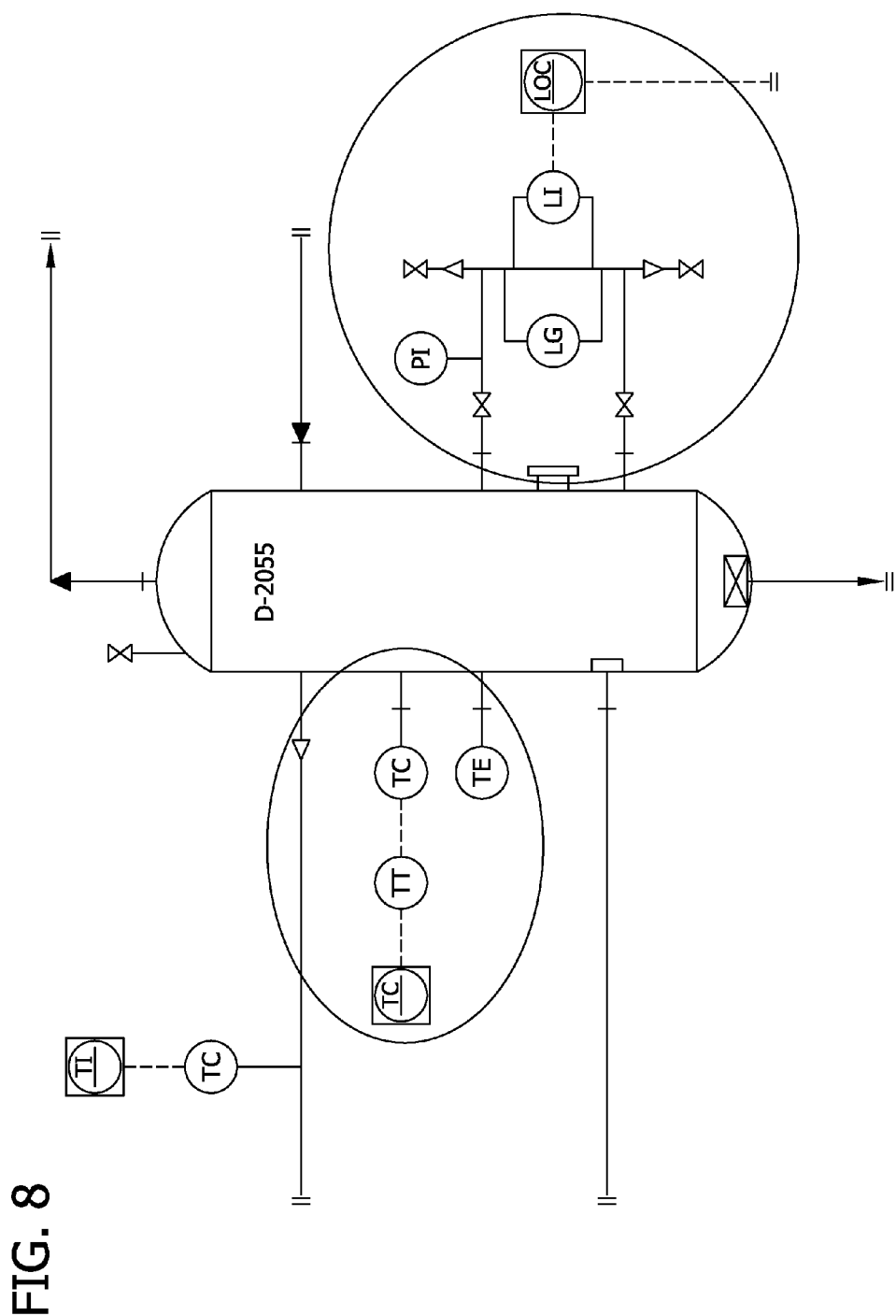
FIG. 8 illustrative depicts an example of a piping and instrumentation diagram.

A workflow process for creating the process/plant equipment simulation models in accordance with the computerized/automated simulation model generator described herein begins with piping and instrumentation diagrams (P&IDs), which contains significant information needed to build a process simulation model. An example of a P&ID drawing is provided in FIG. 8. It is not necessary to go into detail with regard to the particular elements depicted in the illustrative drawing as such drawings are very well known to those of ordinary skill in the relevant art. In addition to showing piping and major equipment and unit operations, the P&ID also indicates interfaces of the identified equipment to process control system control loops. Such control interfaces are depicted as circles on FIG. 8. Again, the convention of using circles on a P&ID drawing is well known to those skilled in the art.

Today, P&ID descriptions are available in "smart" electronic form. In an illustrative embodiment the smart P&ID descriptions comprise structured data objects defining plant equipment according to an established description convention. In a particular embodiment the smart description convention corresponds to a well known SMARTPLANT FOUNDATION P&ID description convention. Plant/process equipment drawings defined according to SMARTPLANT FOUNDATION conventions are referred to herein as SP P&ID drawings. SP P&ID definitions comprising objects encoded on computer-readable media are interpretable by appropriately programmed computers to render appropriate displays. Furthermore equipment described within a P&ID drawing file is interpretable, using an object translation framework, as a set of model objects or control I/O points to render an appropriate process simulation model for use in creating a simulation model containing both a simulated process and a control system to which the simulated process is connected.

Figure 9:
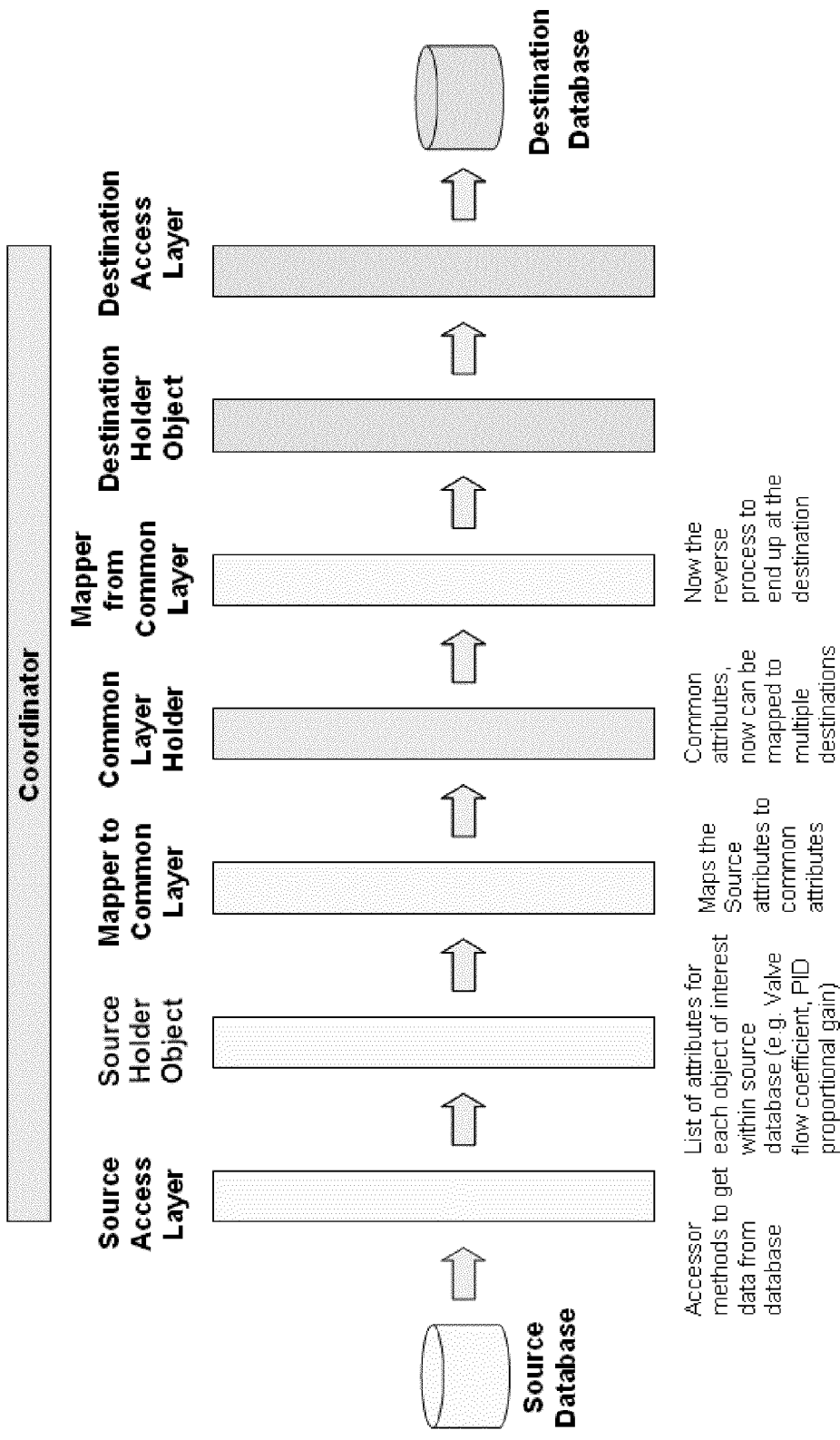
FIG. 9 is an exemplary workflow for converting data objects from smart P&ID drawings (source) to process simulation model objects (destination) using a set of pre-defined mapping files (rules) and conversion functions.

FIG. 9 shows an exemplary workflow associated with an exemplary embodiment of the aforementioned object translation framework. The summarized/depicted stages of the translation framework, implemented on a programmed computer system, automatically (or with minimal manual intervention) convert data objects from the smart P&ID drawings (source) to process simulation model objects (destination) using a set of pre-defined mapping files (rules) and conversion functions.

Figure 10A:
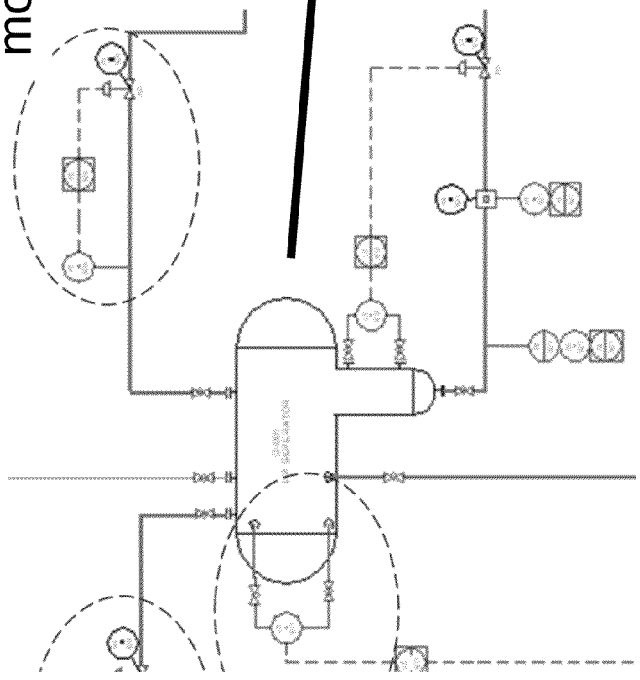
FIG. 10A illustratively depicts an example of a translation procedure (from a P&ID drawing form to a process simulation model object drawing)
Figure 10B:
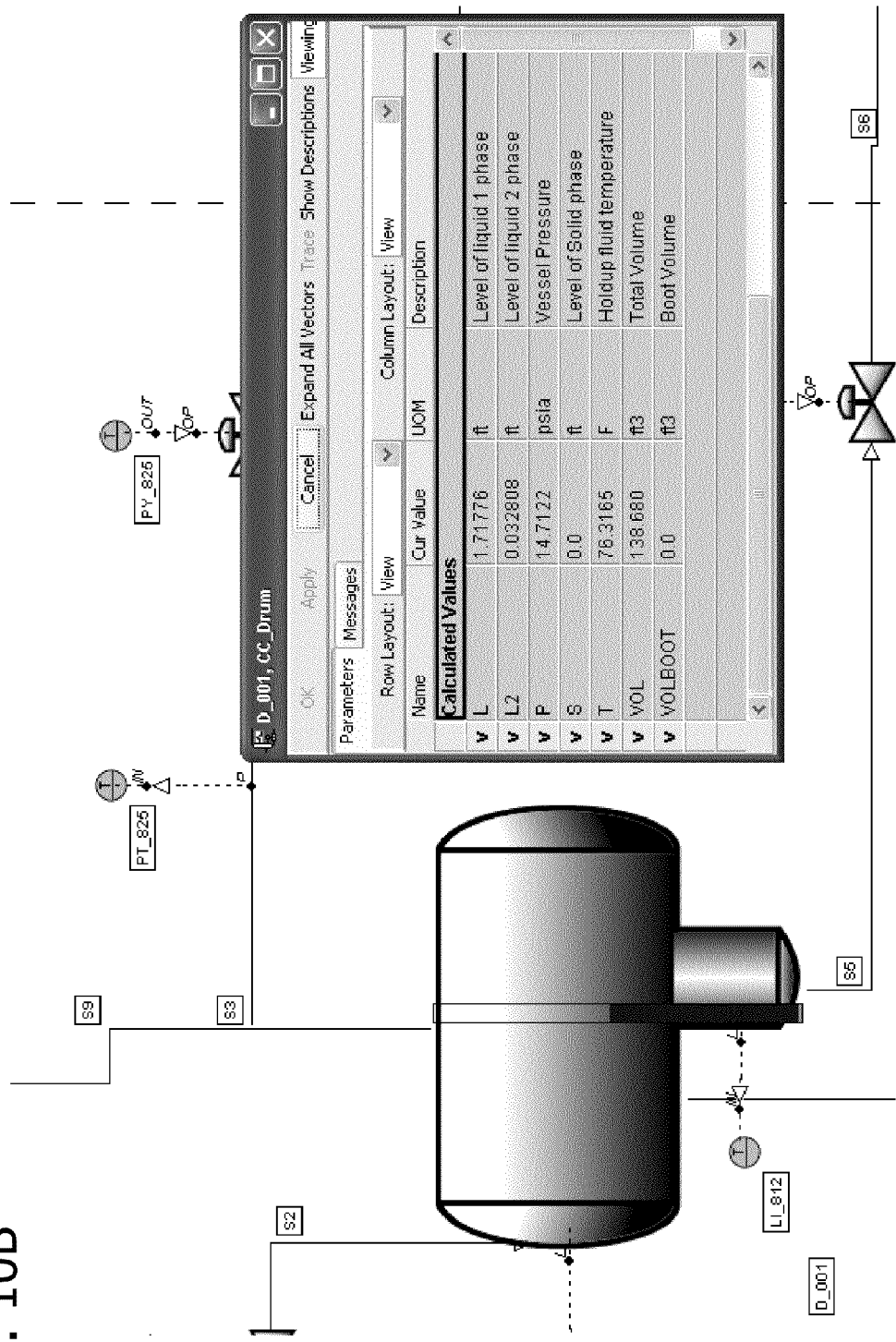
FIG. 10B illustratively depicts an exemplary user interface that includes a dialog box for presenting live data output values from the vessel process simulation model.

An example of a translation procedure (from a P&ID drawing form to a process simulation model object drawing) is shown in FIG. 10A. In the illustrative example a vessel object on a P&ID drawing is translated into a vessel simulation model by the translation framework and thereafter instantiated as a vessel simulation model in a simulator application. An exemplary user interface is depicted in FIG. 10B that includes a dialog box for presenting live data output values from the vessel process model. The dialog box includes for each calculated parameter value: a name, a current value, a unit of measure, and a description of the parameter. The dialog box format is intended to be illustrative.

Figure 10C:
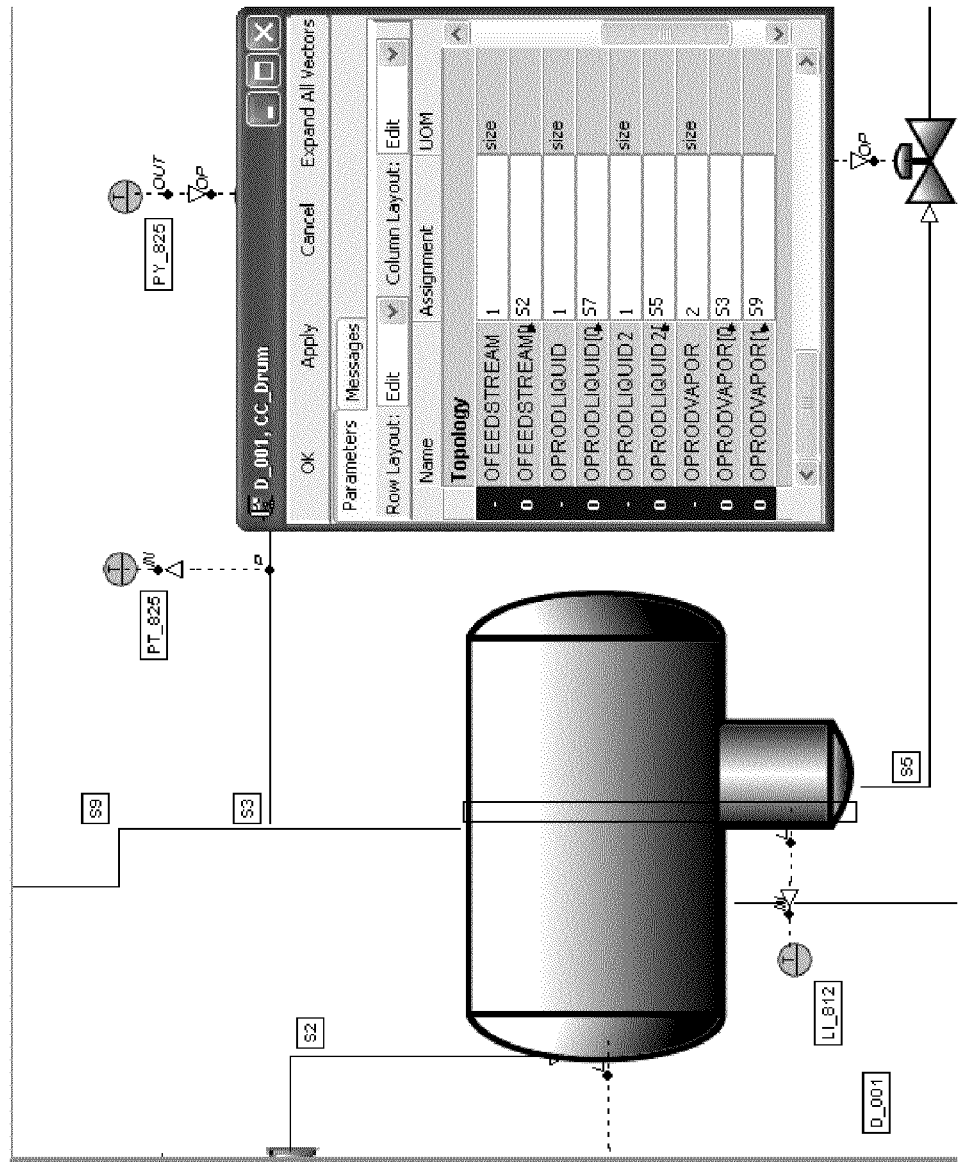
FIG. 10C illustratively depicts an exemplary model configuration topology (e.g. process stream connections), as rendered from the SP P&ID by the Translator and presented in an exemplary Topology dialog box.

FIG. 10C shows an exemplary model configuration topology (e.g. process stream connections), as rendered from the SP P&ID by the Translator and presented in an exemplary Topology dialog box. The smart P&ID drawing definition is used by the automated translation framework to complete the configuration of the interconnecting piping between major pieces of equipment and to connect simulated control system I/O to the appropriate output parameters of the process simulation model objects—again using a set of pre-defined rules. For instance, any instrument marked "LI" (i.e. tank level instrument) attached to a vessel in the P&ID description, is automatically connected by the translator framework (executed on, for example, an personal computer system) to the .L output parameter (i.e. model tank level) of the vessel simulation model object created by the initial transformation of the vessel object definition provided in the original smart P&ID drawing file. Other information specified by the smart P&ID drawing (source) definition includes pipe connections to nozzles, nozzle location on vessel, instrument location equipment, normal equipment operating conditions (e.g. pump head vs. flow design point), and connection to other P&ID drawing definitions via off-page connectors.

Depending on the desired accuracy of the process (equipment) simulation model, the smart P&ID drawing file (e.g., an SP P&ID definition file) is potentially all that is required to configure a process simulation model suitable for control system checkout. If a higher-fidelity model is required, say for an operator training simulator, then the translation framework incorporates additional processing stages to generate linkages/transformations that supplement and enhance the basic model created from the smart P&ID drawing definition.

Figure 11A:
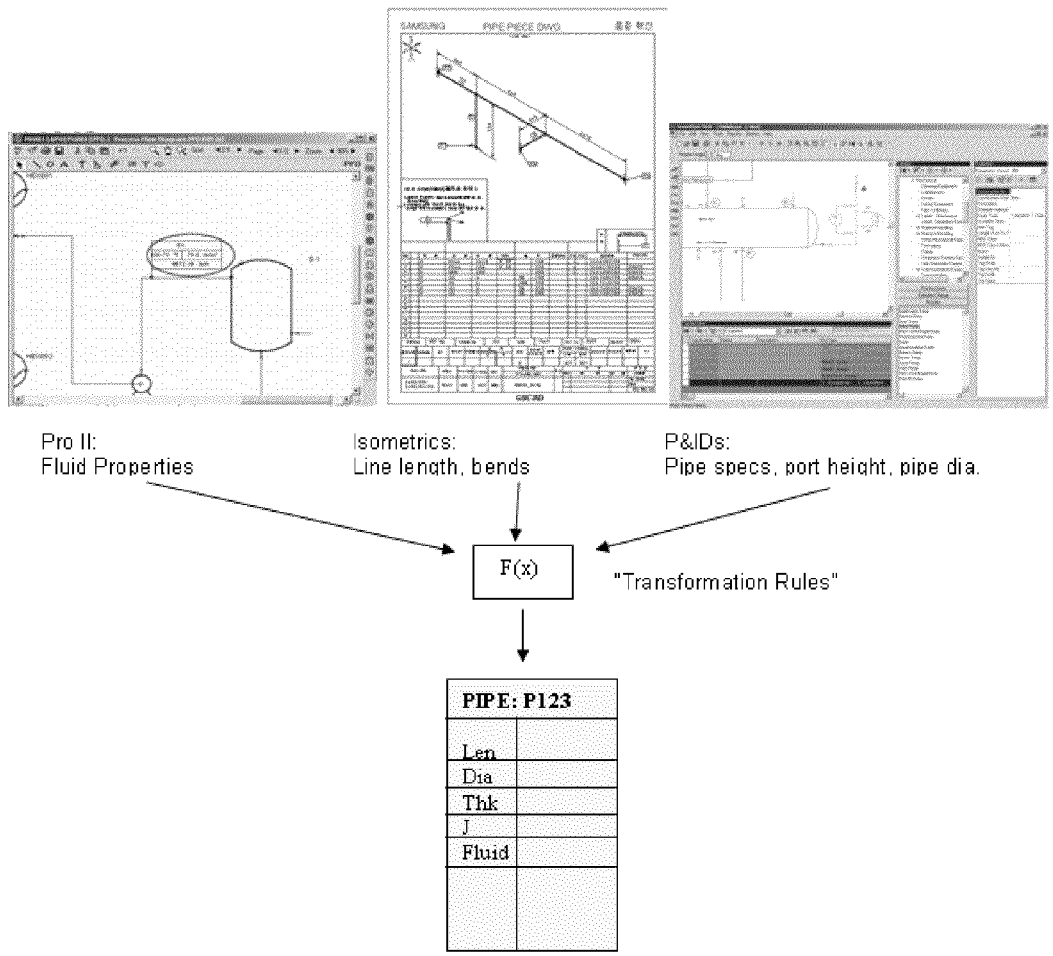
FIG. 11A shows a translation framework wherein steady-state analysis outputs and isometric drawings are combined with a smart P&ID drawing definition to render a fully parameterized process simulation model for a pipe.

For example, FIG. 11A shows a translation framework wherein steady-state analysis outputs (e.g., Pro II: flows and thermodynamic state properties at various points in the process) and isometric drawings (showing pipeline lengths and bends) are combined with a smart P&ID drawing definition to render a fully parameterized process simulation model for a pipe that incorporates specific design conditions potentially affecting the response behavior of the pipe.

By having established connections to the supplemental process simulation model data sources, the transformations can be run again to accommodate plant design changes. However, there may be certain areas of the model that are customized or otherwise need to be protected. A protection flag is provided with the resulting simulation model objects to prevent their inadvertent modification or destruction.

It may be possible that results from simulation testing or analyses may drive required design changes in the plant. To facilitate this, the translation framework includes a "reverse transformation" rules stage that populates the design databases with the updated information. In this case, the meaning of "source" and "destination" in FIG. 9 are reversed.

Glossary of Terms Used to Describe a Particular Translation Framework Example

Figure 14:
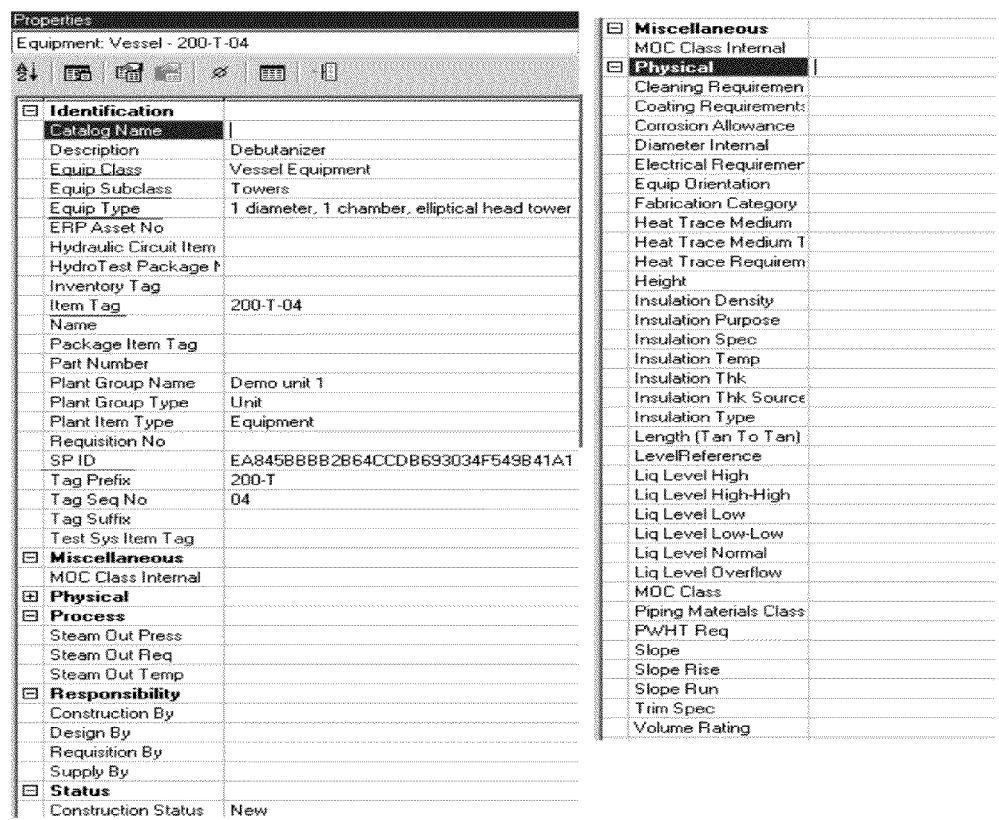
FIG. 14 shows some of the configuration data available in the SMARTPLANT P&ID native user interface environment.

AMG—Automatic Model Generation
ACDG—Automatic Controls Design Generation
SP P&ID—SMARTPLANT Piping and Instrument Diagram
SMARTSKETCH—A tool available from the Intergraph Corporation to view just the graphical part of an SP P&ID
FIG. 14 shows some of the configuration data available in the SMARTPLANT P&ID native user interface environment. Another application, SMARTPLANT Instrumentation (not shown) contains information in database format about control system Input/Output (I/O) tags, and relates the I/O tag information to the instrument tag identifier in the P&ID definition. From here, the auto-model generator performs the following steps to create the process model:

Each P&ID in the SP P&ID project is translated from its native file format (.pid) to the common layer holder form in XML format (see, FIG. 9).

The AMG parses the native file format (.pid) files and converts each P&ID object into a DYNSIM process simulation model object, via the source object's AABBCC equipment code, and the P&ID-to-model mapping file (see, FIG. 11B).

The AMG locates instrument transmitters on the source P&ID description and creates a transmitter model object. The transmitter object is connected to the correct model object connecter as identified on the P&ID, and further is connected to the appropriate model output parameter (e.g. pressure, temperature, flow, etc.) as defined by the instrument mapping table (see, FIG. 13).

The AMG parses an instrument database dump file (in .csv format) and searches for I/O tag units-of-measure (inches, feet, pounds-per-square inch, etc.). For any UOM not identified, the user is prompted to enter the desired target mapping UOM.

While the instrument file is being processed, AMG creates a mapping table that relates P&ID transmitter tag identifiers to corresponding control system block names and parameters.

The AMG produces the simulation model file in XML format.

Thereafter, the simulation model is re-stored by importing the XML format simulation model file into, for example, the DYNSIM application.

Once the simulation model has been re-stored, a cross reference table is updated in the simulation model using the previously created transmitter mapping table.

The result of the AMG process is a dynamic simulation model, with defined transmitters connected to process simulation unit models, and cross referenced to appropriate I/O tags in the actual/virtual control system.

Figure 12:
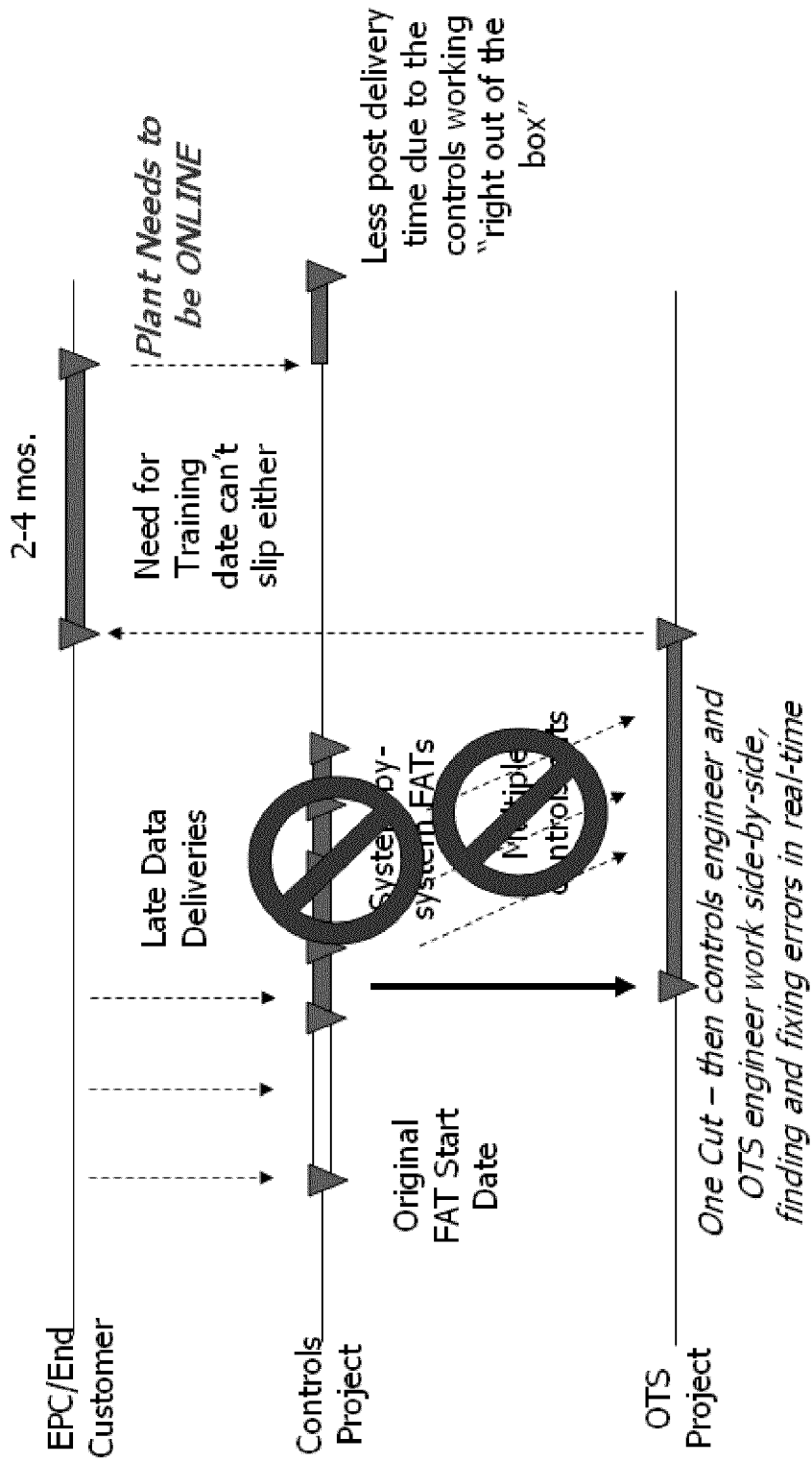
FIG. 12 summarizes an exemplary workflow facilitated by the automated translator framework described herein.

FIG. 12 summarizes an exemplary workflow facilitated by the above described automated translator framework (in the form of computer-executable instructions carried out on a personal computer) for generating process simulation models for plant equipment from smart P&ID drawing definitions (including a set of descriptive objects).

Figure 13:
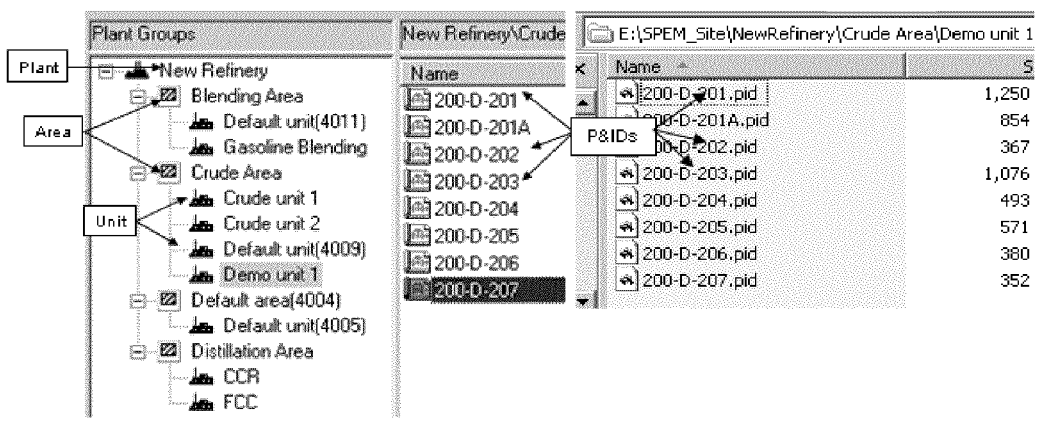
FIG. 13 depicts an exemplary user interface depicting contents of an instrument mapping table.

1. A designer/developer attends kick-off meeting, discusses transformation rules that will be used to transform P&IDs into process model
   a. minimum line size below which is ignored
   b. process line types (fluid)
   c. design operating conditions
   Also discusses desired fidelity level: medium or high 2. The designer enters a set of rules into the translator framework that determines how the source P&ID object is mapped to simulation model object. The translation is based on the source AABBCC code (discussed later), mapped to a target model object configuration. FIG. 13 shows such a sample mapping.

3. The designer receives preliminary smart P&IDs from EPC.

4. The designer executes the translation, using the automated translation framework, on object data contained in the smart P&ID drawing files:

a. process model is created,
b. other data sources are synthesized to initialize the process model objects on a one-for-one object naming convention, and
c. simply-emulated controls (sensors, PI controllers, rate limiters) are created in the simulation based on markings on drawings and automatically connected to the process model based on rules and I/O tag naming convention.

5. The resulting simulation model is validated on the "functional controls."

6. A controls engineer publishes the control system. Functional controls are switched off or out, and the functional control tag is replaced with the real instrument tag in the I/O cross reference table.

7. A simulation engineer and a control engineer combine acceptance tests. Jointly-structured acceptance testing satisfies requirements for control system and simulator in one meeting The following summarizes features of an exemplary automated (computerized) translation framework for generating process simulation models. The function of such translation framework (process simulation model generator) is to enable a controls application engineer to checkout/test the accuracy and validity of their control design prior to actually building a physical plant process that incorporates the simulated plant/process design. To this end, the translation framework/process simulation model generator includes functionality that facilitates: (1) Automatically generating process simulations by interpreting the object data in SMARTPLANT P&ID (SP P&ID) drawing files; and (2) Creating a new class of simulation models based at least in part on the descriptions of plant equipment in SP P&ID objects.

In an exemplary embodiment, the automatic simulation model generator, incorporating the translation framework described herein above, includes the following computer-executable software-driven functionality:

(1) Plant items/equipment of interest are translated from SP P&ID objects to corresponding process simulation model object(s);

(2) The pipe-run (piping) connections between plant items are translated using process streams;

(3) The graphical layout of the SP P&ID (locations of the equipment as well as the pipe-run segments) is retained as much as possible when translated to a simulation model view;

(4) Each SP P&ID drawing is translated to a simulation model flowsheet (one model flowsheet diagram per P&ID drawing) in the simulation;

(5) Supports automatically updating the process simulation model instances to entries within an I/O cross-referencing table using tag data from the control instrumentation database.

FIG. 13 depicts an exemplary P&ID database arrangement for a plant design definition represented in a hierarchically arranged (tree) user interface. A Plant object ('New Refinery') is identified as a root item in the exemplary user interface. A Plant contains one or more sub-nodes corresponding to plant Areas. An Area node, in turn, contains one or more Units, and a Unit contains one or more P&ID drawings. The drawings are saved as .pid ("piping and instrumentation diagram") files. The generation of process models is carried out, in the illustrative embodiment, on the objects contained in the .pid drawing files.

Furthermore, each object in the P&ID (.pid) drawing file contains a set of properties/attributes. FIG. 14 illustratively depicts an exemplary user interface including a set of readable properties/attributes for an SP P&ID drawing object. Such properties/attributes are well known (documented) to those skilled in the art and therefore will not be repeated here. Except the "Item Tag" and related properties (Tag Prefix, Seq No, etc.) users may not specify values for the SP P&ID drawing object properties. In many cases users are not even permitted to specify a value for the Item Tag. For each item drag-dropped on the drawing, an ID is assigned that is used internally (e.g., EA845BBB2B.). This ID is used to resolve the data associated with an object as well as its connection to other objects (via pipe runs, signal lines, etc.).

In an exemplary embodiment, the translation framework for rendering process simulation models from SP P&ID drawing files supports adding custom symbols and custom parameters in the P&ID application. By way of example, an "AABBCC" code is associated with each SP P&ID drawing symbol instance. The same code may be shared between multiple symbols, i.e., the customer symbol for a valve may look different but its AABBCC code could be the same as the default one. To handle custom symbols, the processing uses the AABBCC code described further herein below.

In the SP P&ID representation of a plant/process drawing, each plant item type/class is represented internally by an AABBCC code. For example, 6Q1C06 represents a ball valve. In an exemplary embodiment, a mapping file maps each AABBCC code to a simulation process model class. For example,

```
<Attribute Value="1B2G04" NewValue="Drum"/>
<Attribute Value="1C3A13" NewValue="HeatExchanger"/>
<Attribute Value="1D4B20" NewValue="ScrewCompressor"/>
<Attribute Value="1N1A01" NewValue="FlangedNozzle"/>
```

If an entry is not specified, it is translated by the SP P&ID object translation framework as is, i.e., the ComponentClass=AABBCC code in the output xml.

It is also possible to ignore an item by specifying "ignore" as the new value. For example:

<Attribute Value="7Q4D65" NewValue="ignore"/>.

Figure 15:
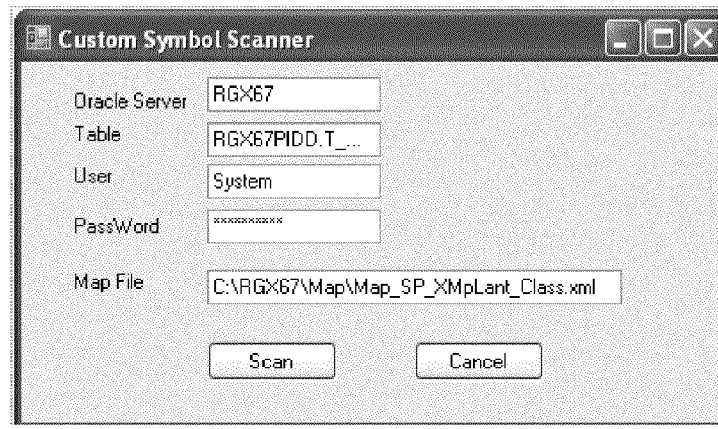
FIG. 15 provides an exemplary user interface (dialog box) for a tool associated with the process simulation model generator's translation framework supports scanning a database for custom AABBCC codes.

Also, with reference to FIG. 15, a tool associated with the process simulation model generator's translation framework supports scanning a database for custom AABBCC codes. By way of example, custom symbols belong to one of the existing groups such as: Equipment, Instrumentation, etc. Relevant information for an SP P&ID object (like its AABBCC code, name, etc) is stored in a drawing file. When a customer database is installed and ready for automatic model generation, the custom AABBCC code scanning tool initially identifies any symbols (objects) containing an unmapped custom AABBCC code. The scanning tool renders a list of symbols for which an AABBCC code mapping does not yet exist. A control engineer then maps the unmapped symbols. A corresponding entry is added to the code mapping file.

One approach to creating a process control system for use in combination with process simulation models is the Automatic Controls Design Generation (ACDG) approach. A schematic drawing showing the general workflow/staging of the translation process from SP (XML) definitions of a process control system to system-specific (executable) process control system definitions for use in a process simulation (connected to process simulation models) is shown in FIG. 12. The ACDG software components interpret the SP XML definition of a process control system and Instrumentation data to perform the conversions and/or auto-generation of controls and graphics. The generated process simulation model files are then transferred to the Control System Engineering Workstation. The user downloads the resulting control system database and operator graphics files. The engineering workstation, attached via a local network, downloads the control system database blocks to run on the virtual control system located on the Simulation Platform.

Figure 16:
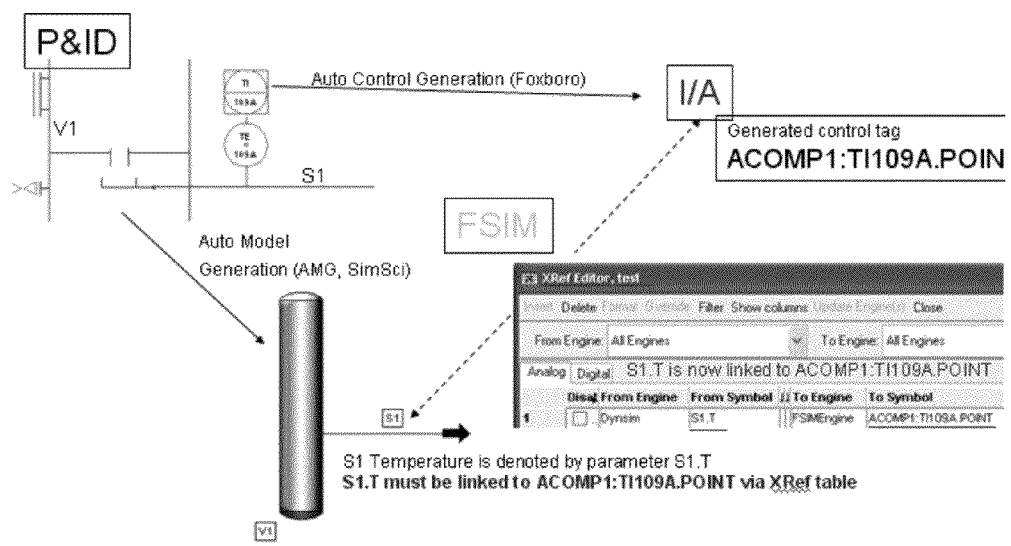
FIG. 16 depicts and exemplary workflow for generating a process simulation model from SP P&ID objects.

An exemplary workflow is depicted in FIG. 16 for generating a process simulation model from SP P&ID objects. In this illustrative example, the computer-executed ACDG components generate the control system while the AMG generates the process simulation model. The control system I/O blocks are thereafter linked to the process simulation models to facilitate check-out by the control engineer. FIG. 16 contains a simple P&ID diagram containing a tower object (V1) connected to a pipe-run (S1). A temperature transmitter (TE109A/TI109A) is attached to the pipe-run S1. Upon completion of the ACDG, control loops have been created, and there is a control tag, for example, ACOMP1: TI109A.POINT, corresponding to the temperature instrument. In the case of the process AMG, V1 is translated to a tower/column model object with a process stream S1 attached to it. A transmitter model object corresponding to TI109A is connected to the parameter T in S1, which denotes the temperature, and is automatically linked to the control tag ACOMP1:TI109A.POINT using the cross-reference utility in DSS. The data on the mapping between process instruments (TE109A/TI109A) and the control tag (ACOMP1: TI109A.POINT) is available in the ACDG database. The AMG component is aware of the mapping between process instruments and the model object parameter (S1.T) via a mapping file that relates transmitter type (determined by the tag naming convention and engineering units-of-measure) to the appropriate stream property in the model. A sample Instrument mapping file and units-of-measure mapping file is shown in FIG. 17. Finally, using the file that extracts P&ID tag name related to a control system I/O point, the Transmitter output (with same identifier as P&ID tag) is related to the control system I/O point in the cross-reference table.

III. Providing and Utilizing Cause and Effect Models for Control System Instrument Testing Having described automated creation of process simulation models from P&IDs that incorporate, to a certain degree, physical response behaviors of actual plant process equipment, attention is directed to a cause and effect-based simulation model that is created from, for example, model a simulation model library (e.g., process simulation library 402). The simulation model library would include most common unit operations models and corresponding cause and effect matrices (see, e.g., FIG. 19) rendered from the models. In case a model corresponding to a unit on P&ID is not found in the library a 'black box' model is created with an empty matrix that a user populates based on the process knowledge. Thereafter outputs of a dynamic process simulation incorporating the cause and effect simulation model are connected to I/O blocks of a control system (virtual or actual) in a simulation environment for personnel training and verification of the process control system logic/configuration and the process design (including plant equipment) as a whole.

Figures 18, 19:
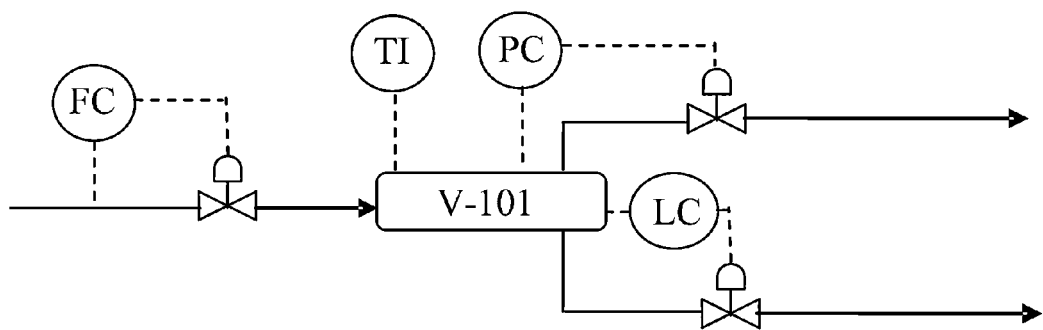
FIG. 18 is a schematic diagram which represents a subsection of a P&ID.
FIG. 19 is a cause and effect matrix corresponding to the process unit simulation model depicted in FIG. 18.

Turning to FIGS. 18 and 19, to generate a simulation from P&IDs, each process equipment unit needs to be recognized. Some examples of equipment units are: heat exchanger, compressor, flash drum and distillation column. Equipment units are configured and connected according to the P&IDs within a simulator system. Simple single-loop models are insufficient to test the interactions of multiple-interacting loops, and high-fidelity models face the following challenges making them a difficult or even infeasible choice:

1. To configure a high fidelity simulation additional data such as process stream properties and material thermodynamic properties are necessary. Most of the P&IDs do not include this data.

2. Even if this data is available, it is typically beyond the skill-domain of the control application engineers, which makes them reluctant users.

3. Even after the configuration is complete, additional work is typically required to make the simulation stable and usable. Expensive resources in the form of simulation engineers are required for this work.

To accurately simulate multiply-interacting control loops with a process, without the complications of the high-fidelity models, "cause and effect" matrix-based models are generated and incorporated into a process simulation model for use in a process simulation.

Consider the schematic diagram shown in FIG. 18 which represents a sub-section of a P&ID. The diagram includes a vessel V-101. Feed to the vessel V-101 is controlled with an instrument FC (feed control), the vessel V-101's pressure is controlled via an instrument PC (pressure control), and the vessel V-101's liquid level is controlled via an instrument LC (level control). The vessel V-101's temperature is indicated by an instrument TI. The instruments FC, LC and PC can cause changes to occur within the vessel V-101 and the product produced by the vessel V-101. The effect of these changes is generally visible at instruments FC, LC, PC and TI. A high fidelity simulation is normally required to show this interdependency.

In accordance with an exemplary embodiment, to provide a same interdependent response without additional data or expertise, the vessel V-101 is modeled using a two-dimensional cause and effect matrix as shown in FIG. 19. In the illustrative example, a pair of numbers within each cell of the matrix represents a transfer constant and a time constant. For instance, for each unit change in the value of FC, the value LC changes by 0.2 units with a first-order lag time constant of 300 seconds. So for each increase of 1 liter/sec in feed, the level will increase by 20%. The level increase within the vessel V-101 is offset by a controller action modifying the value for the LC to maintain a desired level within the vessel V-101. The matrix thus represents the interdependency between the FC and LC values without a need for additional data simplifications of the underlying physical phenomenon inside the vessel.

Where high fidelity models use highly-coupled equations of state for thermodynamics in combination with conservation principles or mass, momentum, and energy, the simulation models assume constant thermo-physical properties, simple mass balance for vessel level, a simple and tunable approximation for energy and temperature changes, and graphically-based determination of pressure vs. temperature. The model is simple and accurate around a specified-design point, and is robust such that if the control were to deviate significantly from the design point, the response would always be within the realms of reality (i.e., the vessel never runs empty nor overfills). The cause and effect models are not necessarily physically-based, and so it is possible to violate the conservation of mass, momentum, and energy for the sake of easy controls checkout.

The following describes an exemplary workflow for creating a cause and effect model for a simulation model. A library set of constants required in the above table is generated and provided for control testing for commonly-available processes (e.g. a Crude Column or a Deethanizer or FCC Main Column). If a closer match is required or the unit is a non-standard unit, the unit can be modeled using generic data in a steady state simulator to obtain these constants, with a modest effort of the services of a simulation engineer.

Workflow for Creating a Cause & Effect Simulation Model:

1. Translate (electronically) the P&IDs to recognize processing units.

2. The Translation step includes identifying flow and process devices, and correlating such devices to pre-defined process simulation library models. Specify a library component such as air, water, steam or thermal fluid for the component slate. Thermodynamic calculation methods can be documented for use with these specific components. Such approximations are possible as the 'cause and effect' holdup models will provide the necessary stability.

3. Update the cross-reference database automatically, to connect control and safety system I/O points to transmitter models found on the P&ID and in the automatically-generated model. This allows elements of a process simulation model to communicate process information to/from the control system.

4. Identify holdup units and instantiate them with 'cause and effect' models provided from a process simulation model library. Correlate the cause and effect models with the type option available on a particular equipment simulation model (e.g., a horizontal drum or de-ethanizer column simulation model). The simulation model is now ready to run with default parameterization. The model will operate and will calculate flows, pressures, temperatures, etc., although the values may not match the actual expected values in a real plant.

5. To make the model produce numerical values that are in ranges of expected values, in an exemplary embodiment desired reference values are entered in the transmitter simulation model objects and the transmitter output is re-scaled by selecting a "tune" feature in a simulation configuration interface. The parameter tuning feature enables producing realistic values without having to modify the plant process simulation model itself.

6. For some very specific units, a process simulation model option type may not be available. In that case a user generates the necessary data via an all-purpose user-configured model. This data can be obtained from the plant operation manuals, operator interviews or operations data from similar plants. If data is not available from these sources, a user creates a steady state model for incorporation into a process simulation model.

7. Optionally, to obtain greater accuracy, a process simulation model is modified to enter expected values in the model unit operations. A user specifies instrument design data at model feed and product streams. Only the streams of interest are modeled. This data is common, easily available, and requires no intermediate calculations by the user.

8. The instantiated process simulation model should be at the design point and stable. The simulation model is now ready for control testing.

The cause and effect matrix for a unit can be incorporated in two ways, internally or externally. The internal matrix would be intrinsic to the model code. The actual coefficients are modified using a model viewer/editor. An external matrix is incorporated with an external link to a tool such as Microsoft Excel or OPC (OLE for Process Control) link to products such as Invensys Systems, Inc.'s INFUSION. In this case the coefficients are modified using the external tools' native interfaces. At runtime the simulation model is initialized via this link.

The matrix as shown in FIG. 19 includes 2 coefficients for each cause/effect pair. These coefficients correspond to the conversion constant and the first order lag time constant respectively. For example, these coefficients for the FC (cause)/LC (effect) pair are 0.2 and 300 in FIG. 19. This means that for every unit increase in FC, the LI (indicator for LC) will increase by 0.2 units at steady state. The approach to this 0.2 unit increase is governed by the first order lag equation:

$$dx/dt = 1/T(a-x)$$

where x=initial value, a=final value, t=time and T=lag time constant

For the above case of FC/LC, this equation will be:

$$d(LI)/dt = 1/300(1.2*(FC - FC_{steadystate})*LI).$$

The cause and effect models are initialized with the initial values of all cause variables. At runtime, the actual values of the cause variables are fed (input) into the models through the corresponding input blocks. The output from the modes is calculated using the equation as above and is sent to the appropriate output block.

This methodology can be extended for processes requiring dead time or other correlations through additional tables (not shown). These additional tables can be processed by the cause and effect models in a similar way.

In view of the many possible embodiments to which the principles of this invention may be applied, it should be recognized that the embodiments described herein with respect to the drawing figures, as well as the described alternatives, are meant to be illustrative only and should not be taken as limiting the scope of the invention. The functional components disclosed herein can be incorporated into a variety of programmed computer systems as computer-executable instructions stored on computer readable media in the form of software, firmware, and/or hardware. Furthermore, the illustrative steps may be modified, supplemented and/or reordered without deviating from the invention. Therefore, the invention as described herein contemplates all such embodiments as may come within the scope of the following claims and equivalents thereof.

What is claimed is:

1. A method for automatically providing process simulation models from piping and instrumentation diagrams for a process, the method comprising:

acquiring structured data objects representing, in electronic form, a piping and instrumentation diagram of a process, the structured data objects including an interface to process control loops, said structured data objects being used as input data for forming a process simulation model;

generating a virtual control system from the piping and instrumentation diagram of a process, said virtual control system comprising one or more virtual control system I/O components;

acquiring piping data representing, in electronic form, the piping and instrumentation diagram of a process, the piping and instrumentation diagram comprising connections to the virtual control system I/O components and among the structured data objects;

translating the structured data objects representing process objects in the piping and instrumentation diagram into process simulation model objects, the structured data objects representing the process objects other than the control system I/O components, the translating being performed automatically using predefined mapping definitions and conversion functions, and wherein the predefined mapping definitions and conversion functions include a predefined conversion function comprising:
- extracting an identifier from a source data object of the structured data objects;
- selecting, based on the identifier, a destination process simulation model object from a plurality of process simulation model objects contained in a simulation model object library; and
- mapping, using a predefined mapping definition, the destination process simulation model object to the source data object; and assigning a connection between the destination process simulation model object and at least one of the virtual control system I/O components based on the piping data, the assigning being performed automatically, by a computing device, using predefined rules, the assigning comprising:
- determining, from the piping data, that a piping connection connects the source data object to the at least one of the virtual control system I/O components on the piping and instrumentation diagram via a process stream, said source data object having been translated into the destination process simulation model object; and
- using a parameter of the process stream to determine connection to the at least one of the virtual control system I/O components, said determining based on a type of the at least one of the virtual control system I/O components and a property of the parameter of the process stream.

2. The method of claim 1, further comprising acquiring process model input data in electronic form from additional sources in addition to the piping and instrumentation diagram, and wherein the translating step incorporates the process model input data from the additional sources into the process simulation model objects.

3. The method of claim 2, wherein the process model input data from additional sources includes thermodynamic properties.

4. The method of claim 2, wherein the process model input data from additional sources includes flow properties.

5. The method of claim 1, further comprising integrating cause and effect models into the process model, the cause and effect models represented by two-dimensional matrixes where a first dimension specifies a cause and a second dimension specifies an effect.

6. The method of claim 1, wherein translating further comprises automatically rendering the process simulation model objects.

7. The method of claim 1, wherein the process simulation models comprise a control processor representation.

8. The method of claim 7, wherein the process simulation models comprise function block representations associated with the control processor representation.

9. The method of claim 1, wherein the process simulation models comprise a physical input/output interface representation.

10. The method of claim 9, further comprising connecting the process simulation model data objects to the physical input/output interface representations.

11. The method of claim 10, wherein connecting is achieved via a cross-reference table tying the process simulation model objects to the I/O component representation.

12. A method for providing a process simulation model for a process that includes potentially complex interactions between control points within the process, the method comprising:
- providing an electronic representation of a piping and instrumentation diagram conforming to a P&ID description convention, the electronic representation comprising a set of structured data objects and piping data, the piping data representing a connection between at least two of the structured data objects as described in the piping and instrumentation diagram;
- generating a virtual control system from the piping and instrumentation diagram of a process, said virtual control system comprising virtual control system I/O components;
- extracting identifiers from the structured data objects and the virtual control system I/O components;
- selecting, based on the identifiers, process simulation model objects other than control system I/O components to form a process simulation model representative of the process;
- assigning, based on the piping data, one or more connections between the process simulation model objects;
- forming connections from the process simulation model objects to the virtual control system I/O components based on the piping data, said connections forming an interface between the virtual control system and the process simulation model; and
- integrating cause and effect models from a library into the process simulation model, the cause and effect models including transfer constants corresponding to a unit change relationship between related process parameters.

13. The method of claim 12, wherein the cause and effect models include time constant parameters representing a lag between cause and effect of two related process parameters.

14. The method of claim 12, wherein the cause and effect models are represented by two-dimensional matrixes where a first dimension specifies a cause and a second dimension specifies an effect.

* * * * *